(12) United States Patent
Brunet et al.

(10) Patent No.: US 9,798,396 B2
(45) Date of Patent: *Oct. 24, 2017

(54) LOW-POWER AND LOW-FREQUENCY DATA TRANSMISSION FOR STYLUS AND ASSOCIATED SIGNAL PROCESSING

(71) Applicant: Atmel Corporation, San Jose, CA (US)

(72) Inventors: Samuel Brunet, Hampshire (GB); Richard Collins, Hampshire (GB); Luben Hristov, Sofia (BG)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/687,691

(22) Filed: Apr. 15, 2015

(65) Prior Publication Data
US 2016/0048224 A1 Feb. 18, 2016

Related U.S. Application Data

(63) Continuation-in-part of application No. 14/461,956, filed on Aug. 18, 2014.

(51) Int. Cl.
*G06F 3/041* (2006.01)
*G06F 3/044* (2006.01)
(Continued)

(52) U.S. Cl.
CPC .......... *G06F 3/03545* (2013.01); *G06F 3/044* (2013.01); *G06F 3/0416* (2013.01); *G01R 27/2605* (2013.01); *G06F 2203/04108* (2013.01)

(58) Field of Classification Search
None
See application file for complete search history.

(56) References Cited

U.S. PATENT DOCUMENTS 5,828,011 A * 10/1998 Partow .................... G06F 3/044
178/19.01
6,081,752 A * 6/2000 Benson, IV ............. G06F 1/30
700/79

(Continued)

FOREIGN PATENT DOCUMENTS

WO WO 2012/129247 A2 9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

*Primary Examiner* — Antonio Xavier
(74) *Attorney, Agent, or Firm* — Baker Botts L.L.P.

(57) ABSTRACT

In one embodiment, a controller includes one or more computer-readable non-transitory storage media embodying logic that is operable when executed to: initiate an acquisition of a first signal from an electrode of a touch sensor according to an acquisition frequency of the touch sensor, store a first modulated signal which includes a modulated form of the first signal, initiate an acquisition of a second signal from the electrode of the touch sensor according to the acquisition frequency of the touch sensor, reverse a polarity of the second signal to produce a third signal, store a second modulated signal which includes a modulated form of the third signal, generate a signal-timing waveform based on the first and second modulated signals, and retrieve information associated with a stylus from the generated signal-timing waveform.

24 Claims, 13 Drawing Sheets

(51) Int. Cl.
*G01R 27/26* (2006.01)
*G06F 3/0354* (2013.01)

(56) References Cited

U.S. PATENT DOCUMENTS

| | | | |
|---|---|---|---|
| 6,377,248 B1* | 4/2002 | Partow | G06F 3/03545 178/18.01 |
| 6,498,403 B1* | 12/2002 | Hagidaira | B62D 5/0484 307/10.1 |
| 7,663,607 B2 | 2/2010 | Hotelling | |
| 7,864,503 B2 | 1/2011 | Chang | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,217,902 B2 | 7/2012 | Chang | |
| 8,599,143 B1* | 12/2013 | Rymarz | G06F 3/03545 345/156 |
| 8,723,824 B2 | 5/2014 | Myers | |
| 8,922,522 B2* | 12/2014 | Atsuta | G06F 3/0418 345/173 |
| 2005/0099188 A1* | 5/2005 | Baxter | G01D 5/24 324/678 |
| 2008/0309635 A1 | 12/2008 | Matsuo | |
| 2009/0289922 A1* | 11/2009 | Henry | G06F 3/03545 345/179 |
| 2009/0315854 A1 | 12/2009 | Matsuo | |
| 2011/0304577 A1* | 12/2011 | Brown | G06F 3/03545 345/174 |
| 2012/0044180 A1* | 2/2012 | Matsui | G06F 3/0418 345/173 |
| 2012/0068686 A1* | 3/2012 | Steiner | H05B 37/0272 323/318 |
| 2012/0105362 A1* | 5/2012 | Kremin | G06F 3/03545 345/174 |
| 2012/0127124 A1* | 5/2012 | Zanone | G06F 1/3231 345/174 |
| 2012/0154340 A1* | 6/2012 | Vuppu | G06F 3/044 345/179 |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |
| 2012/0327040 A1* | 12/2012 | Simon | G06F 3/044 345/179 |
| 2013/0057491 A1* | 3/2013 | Chu | G06F 3/0416 345/173 |
| 2013/0057503 A1* | 3/2013 | Hristov | G06F 3/044 345/174 |
| 2013/0076612 A1 | 3/2013 | Myers | |
| 2013/0106722 A1* | 5/2013 | Shahparnia | G06F 3/03545 345/173 |
| 2013/0106760 A1* | 5/2013 | Pedersen | G06F 3/03545 345/174 |
| 2013/0106797 A1* | 5/2013 | Pant | G06F 3/0383 345/179 |
| 2013/0106912 A1* | 5/2013 | Um | G09G 5/00 345/649 |
| 2013/0207938 A1* | 8/2013 | Ryshtun | G06F 3/0416 345/179 |
| 2013/0207939 A1* | 8/2013 | Kremin | G06F 3/0383 345/179 |
| 2013/0307813 A1* | 11/2013 | Hanssen | G06F 3/044 345/174 |
| 2014/0002422 A1* | 1/2014 | Stern | G06F 3/03545 345/179 |
| 2014/0028577 A1* | 1/2014 | Krah | G06F 3/0416 345/173 |
| 2014/0049478 A1* | 2/2014 | Brunet | G06F 3/0416 345/173 |
| 2014/0152582 A1* | 6/2014 | Agarwal | G06F 3/0418 345/173 |
| 2014/0210491 A1* | 7/2014 | Jonsson | G01R 27/2605 324/661 |
| 2014/0267147 A1* | 9/2014 | Buelow | G06F 3/03545 345/174 |
| 2014/0347317 A1* | 11/2014 | Tanaka | G06F 3/044 345/174 |
| 2016/0054846 A1* | 2/2016 | Lee | G06F 3/0416 345/174 |

* cited by examiner

LOW-POWER AND LOW-FREQUENCY DATA TRANSMISSION FOR STYLUS AND ASSOCIATED SIGNAL PROCESSING

PRIORITY

This application is a continuation-in-part under 35 U.S.C. §120 of U.S. patent application Ser. No. 14/461,956 filed 18 Aug. 2014.

TECHNICAL FIELD

This disclosure generally relates to touch sensors and styluses.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
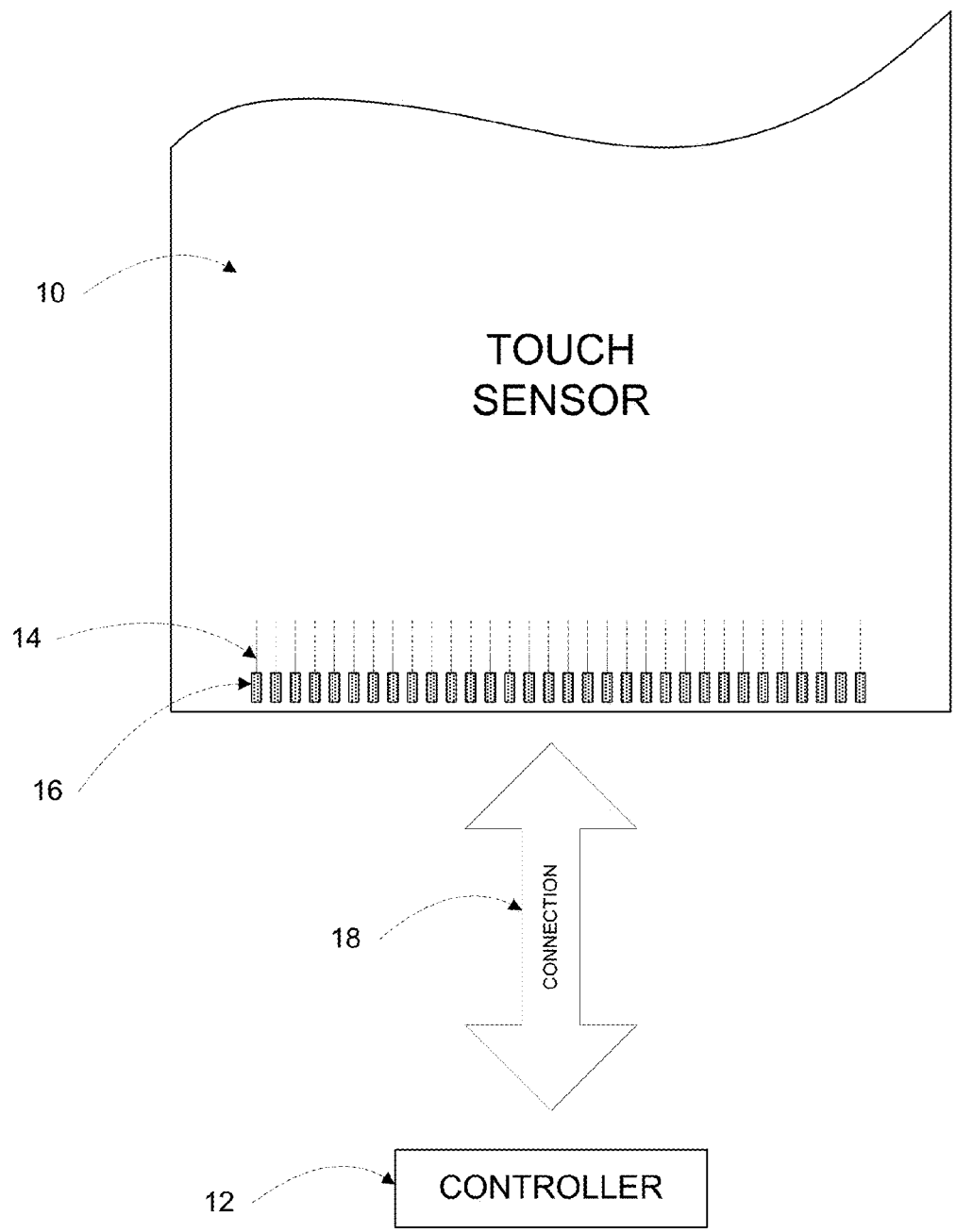
FIG. 1 illustrates an example touch sensor with an example touch-sensor controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a ground electrode, a guard electrode, a drive electrode, or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal (FLM) or other conductive material, such as (for example) copper, silver, carbon, or a copper-, silver-, or carbon-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more microfeatures of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as (for example) glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 μm or less and a width of approximately 10 μm or less. As another example, one or more portions of the conductive material may be silver or silver-based and similarly have a thickness of approximately 5 μm or less and a width of approximately 10 μm or less. As yet another example, one or more portions of the conductive material may be carbon or carbon-based and similarly have a thickness of approximately 5 μm or less and a width of approximately 10 μm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive electrode line running horizontally or vertically or in any suitable orientation. Similarly, one or more sense electrodes may together form a sense electrode line running horizontally or vertically or in any suitable orientation. Additionally, one or more ground electrodes may together form a ground electrode line running horizontally or vertically or in any suitable orientation. In particular embodiments, drive electrode lines may run substantially perpendicular to sense electrode lines. In particular embodiments, drive electrode lines may run substantially parallel to sense electrode lines. Herein, reference to a drive electrode line may encompass one or more drive electrodes making up the drive electrode line, and vice versa, where appropriate. Similarly, reference to a sense electrode line may encompass one or more sense electrodes making up the sense electrode line, and vice versa, where appropriate. Additionally, reference to a ground electrode line may encompass one or more ground electrodes making up the ground electrode line, and vice versa, where appropriate. In particular embodiments, any electrode may be configured as a drive, sense, or ground electrode and the configuration of any electrode may be changed during operation of touch sensor 10. In particular embodiments, configuration of electrodes may be controlled by touch-sensor controller 12.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

In particular embodiments, touch sensor 10 may determine the position of an object (such as a stylus or a user's finger or hand) that makes physical contact with a touch-sensitive area of touch sensor 10. In addition or as an alternative, in particular embodiments, touch sensor 10 may determine the position of an object that comes within proximity of touch sensor 10 without necessarily contacting touch sensor 10. In particular embodiments, an object may come within proximity of touch sensor 10 when it is located some distance above a surface of touch sensor 10; when it hovers in a particular position above a surface of touch sensor 10; when it makes a motion (such as for example a swiping motion or an air gesture) above a surface of touch sensor 10; or any suitable combination of the above. In particular embodiments, determining the position of an object that comes within proximity of touch sensor 10 without making physical contact may be referred to as determining the proximity of an object. In particular embodiments, determining the proximity of an object may comprise determining the position of an object's projection onto touch sensor 10 when the object is located some distance above a plane of touch sensor 10. The projection of an object onto touch sensor 10 may be made along an axis that is substantially orthogonal to a plane of touch sensor 10. In particular embodiments, the position of an object's projection onto touch sensor 10 may be referred to as the position or the location of an object. As an example and not by way of limitation, touch sensor 10 may determine the position of an object when the object is located above the surface of touch sensor 10 and within a distance of approximately 20 mm of the surface of touch sensor 10. As another example and not by way of limitation, touch sensor 10 may determine the position of a passive stylus when the passive stylus is located above the surface of touch sensor 10 up to a distance of approximately 8 mm to approximately 10 mm from the surface of touch sensor 10. Although this disclosure describes or illustrates particular touch sensors 10 that may determine a position of physical contact of an object, a proximity of an object, or a combination of the two, this disclosure contemplates any suitable touch sensor 10 suitably configured to determine a position of physical contact of an object, a proximity of an object, or any suitable combination of one or more of the above.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 µm or less. As another example, the conductive material of tracks 14 may be silver or silver-based and have a width of approximately 100 µm or less. As yet another example, the conductive material of tracks 14 may be carbon or carbon-based and have a width of approximately 100 µm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground electrode lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2:
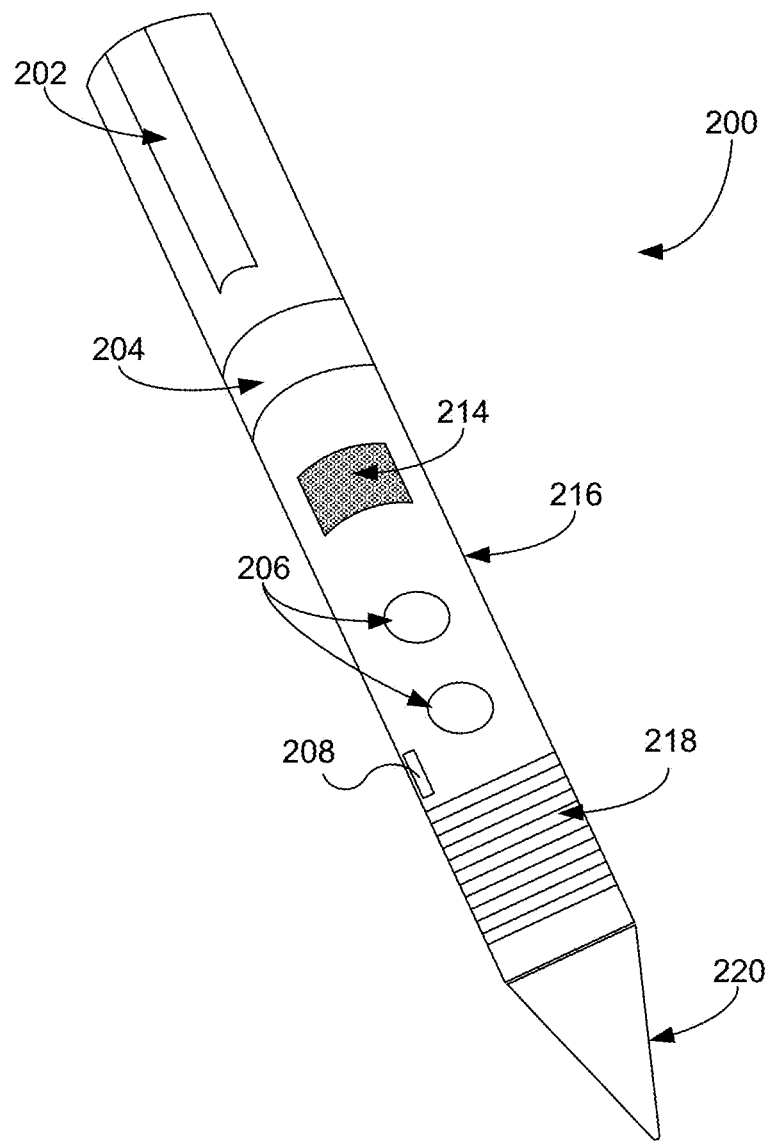
FIG. 2 illustrates an example stylus exterior.
Figure 3:
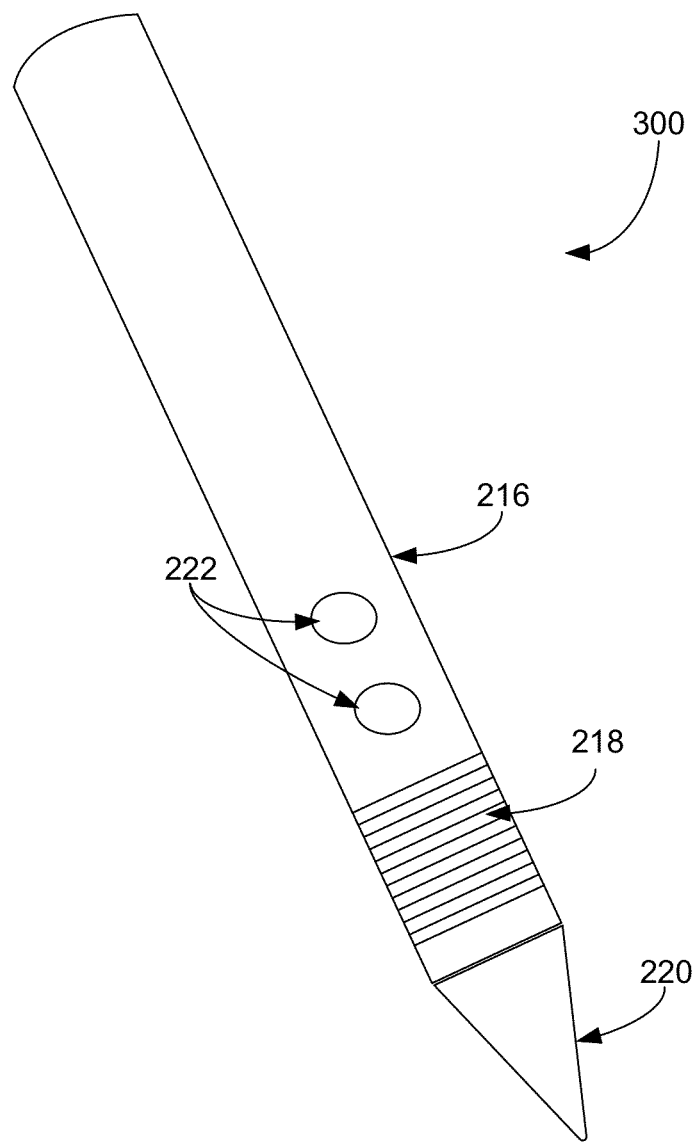
FIG. 3 illustrates another example stylus exterior.

FIGS. 2-3 illustrate example exteriors of a stylus, according to certain embodiments of the present disclosure. As described in greater detail below, the styluses illustrated in and described with reference to FIGS. 2-3 may be implemented as an active stylus, a passive stylus, or a semi-active stylus.

In certain embodiments, an active stylus may include a stylus that includes a power source and is operable to communicate a signal to a device through a touch sensor (e.g., touch sensor 10) of the device. An active stylus may include one or more additional features. In certain embodiments, a passive stylus may include a stylus that behaves like a portion of a human hand (e.g., a finger) or other suitable touch object for purposes of touch detection by a touch sensor, such as touch sensor 10, and that does not communicate a signal to the touch sensor. A passive stylus may lack a power source. In certain embodiments, a semi-active stylus may include a power source and may be operable to communicate, in response to detecting actuation of a signal activator input (e.g., a button) to communicate a signal to a device through a touch sensor (e.g., touch sensor 10) of the device. In certain embodiments, a semi-active stylus may be useable as a passive stylus for purposes of touch detection and may, in response to detecting actuation of the signal activator input, communicate a signal (which may or may not relate to touch detection) to a device through a touch sensor (e.g., touch sensor 10) of the device. These descriptions of an active stylus, a passive stylus, and a semi-active stylus are provided as examples only. The present disclosure contemplates an active stylus, a passive stylus, and a semi-active stylus including additional or fewer features, according to particular needs.

FIG. 2 illustrates an example exterior of stylus 200, which may be used in conjunction with touch sensor 10 of FIG. 1. In certain embodiments, stylus 200 may be implemented as an active stylus. For purposes of this description, stylus 200 will be referred to as active stylus 200; however, the present disclosure contemplates stylus 200 being implemented as another type of stylus (e.g., a semi-active stylus). The active stylus 200 may be powered by an internal or external power source. Active stylus 200 may provide touch or proximity inputs to a touch sensor, such as touch sensor 10 of FIG. 1.

As an example of FIG. 2, active stylus 200 may include external components such as buttons 206, slider 202, and slider 204 that are integrated with outer body 216. Herein, reference to an active stylus may encompass a stylus that includes one or more of a button, one or more of a slider, or one or more of a button and one or more of a slider, where appropriate. Such external components may provide for interactions between active stylus 200 and example device 42 of FIG. 5, between active stylus 200 and a user, or between device 42 and the user. As an example and not by way of limitation, interactions may include communication between active stylus 200 and device 42, enabling or altering one or more functionalities of active stylus 200 or device 42, or providing feedback to or accepting input from one or more users.

Furthermore, outer body 216 may have any suitable dimensions and made of any suitable material or combination of materials. As an example and not by way of limitation, outer body 216 may be made of a conductive material in order to achieve galvanic or capacitive coupling to human body. In particular embodiments, a thin dielectric layer that does not substantially affect the capacitive coupling may be applied on the conductive material. Device 42 may be any suitable device such as a desktop computer, laptop computer, tablet computer, personal digital assistant (PDA), smartphone, satellite navigation device, portable media player, portable game console, kiosk computer, point-of-sale device, or other suitable device.

Although this disclosure illustrates and describes particular components configured to provide particular interactions, this disclosure contemplates any suitable components configured to provide any suitable interactions. As an example and not by way of limitation, external components (such as for example buttons 206 or slider 202) of active stylus 200 may interact with one or more internal components of active stylus 200. As another example and not by way of limitation, pressing one or more buttons 206 may trigger an opening of a menu on device 42 or initiate a help feature on device 42. In particular embodiments, the external components may transmit tip pressure information from active stylus 200 to device 42. In other particular embodiments, the external components may transmit general information such as for example button (for example, buttons 206) status (for example, pushed or not pushed) to device 42. As another example and not by way of limitation, the external components may provide for one or more interactions with one or more devices 42 or other active styluses 200.

As described above, actuating one or more particular external components may initiate an interaction between active stylus 200 and device 42, between active stylus 200 and the user, or between device 42 and the user. Particular external components such as buttons 206 and sliders 202 and 204 may be mechanical or capacitive. The particular external components may function as rollers, trackballs, or wheels. As an example and not by way of limitation, slider 202 may function as a vertical slider that is aligned along a latitudinal axis of active stylus 200. As another example and not by way of limitation, slider 204 may function as a wheel that is aligned along a circumference of active stylus 200. Buttons 206 may be implemented using one or more low-profile mechanical single-pole single-throw (SPST) on/off switches. Capacitive sliders 202 and 204 and buttons 206 may even be implemented using one or more touch-sensitive areas. The touch-sensitive areas may have any suitable shapes, dimensions, or locations. Furthermore, the touch-sensitive areas may be made from any suitable materials. As an example and not by way of limitation, each touch-sensitive area may be implemented using flexible mesh of electrically-conductive materials. As another example and not by way of limitation, each touch-sensitive area may be implemented using an FPC.

Active stylus 200 may include grooves 218 on its outer body 216. Grooves 218 may have any suitable dimensions. Grooves 218 may be located at any suitable area on outer body 216 of active stylus 200. Grooves 218 may enhance a user's grip on outer body 216 of active stylus 200. In the example of FIG. 2, surface 214 may be modified. Accordingly, modified surface 214 of active stylus 200 may possess properties that are different from rest of outer body 216. As an example and not by way of limitation, modified surface 214 may have a different texture, surface temperature, color, or electromagnetic characteristic from the rest of outer body 216. Modified surface 214 may form one or more components on outer body 216. Modified surface 214 may also be capable of dynamically altering one or more properties. Furthermore, the user may interact with modified surface 214 to provide a particular interaction. As an example and not by way of limitation, dragging a finger across modified surface 214 may initiate a data transfer between active stylus 200 and device 42.

One or more components of active stylus 200 may be configured to communicate data between active stylus 200 and device 42. As an example of FIG. 2, active stylus 200 may include tip (or nib) 220. Tip 220 may include one or more conductive rings to communicate data between active stylus 200 and one or more other devices 42 or other active styluses. In particular embodiments, the conductive rings may reside close to the tip in order to reduce attenuation loss of any electrical signals as injected from active stylus 200 to device 42. In other particular embodiments, the one or more conductive rings of active stylus 200 may reside on its outer body 216 or any other suitable part of active stylus 200. In yet other particular embodiments, tip 220 may include pressure sensor that provides or communicates pressure information (for example, an amount of pressure being exerted by active stylus 200 through tip 220) between active stylus 200 and device 42 or other active styluses 200. Tip 220 may be made of any suitable material (for example, an electrically conductive material) and possess any suitable dimension (for example, a diameter of 1 mm or less at its terminal end).

In the example of FIG. 2, active stylus 200 may include port 208 at any suitable location on outer body 216. Port 208 may be configured to transfer signals or information between active stylus 200 and one or more devices 42 via, for example, wired coupling. Port 208 may also transfer signals or information by any suitable low-powered technology, such as RS-232. Although this disclosure describes and illustrates particular stylus comprising particular configuration of particular components having particular locations, dimensions, compositions, and functionalities, this disclosure contemplates any suitable stylus comprising any suitable configuration of any suitable components having any particular locations, dimensions, compositions, and functionalities.

FIG. 3 illustrates another example exterior of a stylus 300, which may be used in conjunction with touch sensor 10 of FIG. 1. In certain embodiments, stylus 300 may be implemented as a semi-active stylus. For example only and not by way of limitation, a semi-active stylus may be considered a stylus that is usable as a passive stylus for purposes of touch detection (e.g., by a touch sensor, such as touch sensor 10, of a device) but that also may be operable to communicate, when appropriate, a signal to a touch sensor, such as touch sensor 10 of FIG. 1, which may be associated with a device, such as device 42 described below with reference to FIG. 5. As an example only and not by way of limitation, a semi-active stylus may be operable to communicate a signal to a touch sensor in response to detecting actuation of a signal activator input, such as a button, on a surface of the stylus. When appropriate, as described in greater detail below, stylus 300 may be powered by an internal or external power source.

Stylus 300 may include various external components. In certain embodiments, stylus 300 may include an outer body 216, grooves 218, a stylus tip 220, and one or more signal activator inputs 222. Although stylus 300 is illustrated and described as including particular components, the present disclosure contemplates stylus 300 including any suitable components, according to particular needs. For example and not by way of limitation, stylus 300 may include any suitable combination of fewer than all of the components shown in FIG. 3, additional components to those shown in FIG. 3, and different components than those shown in FIG. 3. Additionally, although this disclosure describes and illustrates particular stylus comprising particular configuration of particular components having particular locations, dimensions, compositions, and functionalities, this disclosure contemplates any suitable stylus comprising any suitable configuration of any suitable components having any particular locations, dimensions, compositions, and functionalities.

Outer body 216 may have any suitable dimensions and made of any suitable material or combination of materials. As an example and not by way of limitation, outer body 216 may be made of a conductive material in order to achieve galvanic or capacitive coupling to human body. In particular embodiments, a thin dielectric layer that does not substantially affect the capacitive coupling may be applied on the conductive material.

Stylus 300 may include grooves 218 on its outer body 216. Grooves 218 may have any suitable dimensions. Grooves 218 may be located at any suitable area on outer body 216 of stylus 300. Grooves 218 may enhance a user's grip on outer body 216 of stylus 300.

One or more components of stylus 300 may be configured to communicate data between stylus 300 and device 42 by generating and emitting a signal detectable by a touch sensor, such as touch sensor 10 of FIG. 1, which may be associated with a device, such as device 42 described below with reference to FIG. 5, when stylus is in proximity to the touch sensor. As an example of FIG. 3, stylus 300 may include tip (or nib) 220. Tip 220 may include one or more conductive rings to communicate data between stylus 300 and one or more devices 42. In particular embodiments, the conductive rings may reside close to a terminal end of tip 220 in order to reduce attenuation loss of any electrical signals as injected from stylus 300 to device 42. In other particular embodiments, the one or more conductive rings of stylus 300 may reside on its outer body 216 or any other suitable part of stylus 300. Tip 220 may be made of any suitable material (for example, an electrically conductive material) and possess any suitable dimension. As just one particular example and not by way of limitation, tip 220 may have a diameter of approximately 1 mm or less at the terminal end of tip 220.

Stylus 300 may include one or more signal activator inputs 222. Although stylus 300 is shown as including a particular number of signal activator inputs 222, the present disclosure contemplates stylus 300 including any suitable number of signal activator inputs 222. In particular embodiments, signal activator input 222 may be implemented as a button (e.g., similar to button 206), a slider, a trackball, a wheel, a switch, and/or any other suitable mechanism for stylus 300 to receive input (e.g., from a user). For example, signal activator input 222 may be implemented as a mechanical button (or other suitable mechanical input mechanism, such as a mechanical track wheel or switch), a touch sensitive (e.g., capacitive) input area, or any other suitable type of input mechanism for stylus 300 to receive input (e.g., from a user).

Signal activator input 222 may be mechanical or capacitive. Signal activator input 222 may be implemented using one or more low-profile mechanical single-pole single-throw (SPST) on/off switches. Signal activator input 222 may have any suitable shape, dimension, or location. Furthermore, signal activator input 222 may be made from any suitable materials. As an example and not by way of limitation, in the case of signal activator input 222 being a touch-sensitive area, the touch-sensitive area may be implemented using flexible mesh of electrically-conductive materials. As another example and not by way of limitation, each touch-sensitive area may be implemented using an FPC.

Figure 5:
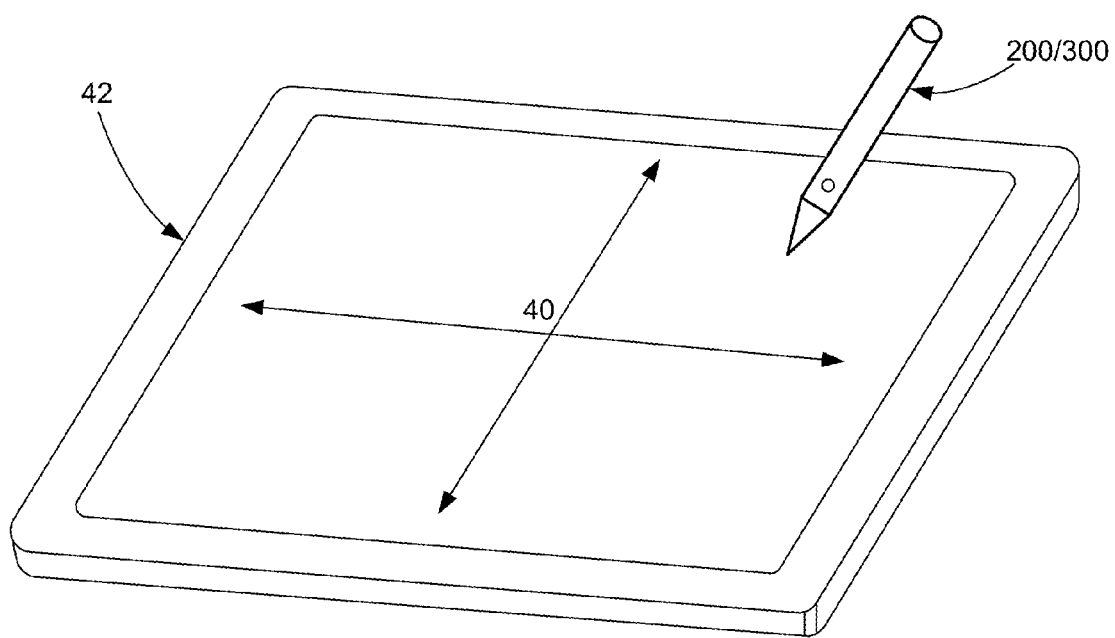
FIG. 5 illustrates an example stylus with an example device.

Signal activator input 222 may provide for interactions between stylus 300 and example device 42 of FIG. 5 by causing stylus 300 to generate, in response to detecting actuation of signal activator input 222, a signal to be emitted by stylus 300, via tip 220 for example. The signal emitted by stylus 300 may be detectable by a touch sensor, such as touch sensor 10 described above with reference to FIG. 1, of a device, such as device 42 described below with reference to FIG. 5, when stylus 300 is in proximity to the touch sensor. A user of stylus 300 may actuate signal activator input 222 to cause the stylus to emit one or more signals detectable by a touch sensor (such as touch sensor 10) of a device (such as device 42). For example and not by way of limitation, when signal activator input 222 is implemented as a button, such as button 206, a user of stylus 300 may actuate signal activator 222 by pressing the button.

In certain embodiments, the signal generated and emitted by stylus 300 in response to stylus 300 detecting actuation of signal activator input 222 may be a low-frequency and high-voltage signal. As an example and not by way of limitation, stylus 300 may generate and emit the low-frequency and high-voltage signal to the touch sensor when signal activator input 222 is in the binary ON state (e.g., when a user of stylus 300 is pressing a button). Otherwise, stylus 300 may not generate and emit the low-frequency and high-voltage signal when signal activator input 222 is in the binary OFF state (e.g., when a user of stylus 300 is not pressing the button). In particular embodiments, the low-frequency and high-voltage signal may be a third-party sinusoid electrical signal, as described below.

The signal emitted by stylus 300 in response to detecting actuation of signal activator input 222 may provide any suitable information to the receiving device, such as device 42. For example, the information may include any suitable combination of a state (e.g., a binary ON/OFF) of signal activator input 222, information usable by the receiving device to detect that stylus 300 is in proximity to the touch sensor of the device, information usable by the receiving device for determining a position (in any suitable dimension) of stylus 300 relative to the touch sensor of the device, information usable by the receiving device to determine a condition of the stylus, information indicating an action to be performed by the receiving device on an object displayed on a display of the device (e.g., moving a displayed object, opening a link, menu, or window on a display of the device, closing a displayed object, initiating a help feature on the device, determining a drawing color, modifying a line width of the displayed object as a function of stylus tip pressure, erasing the displayed object, modifying a standard screen behavior and/or response of the displayed object in response to the emitted signal from stylus 300 versus a touch event by a user's finger, or any other suitable action), and any other suitable information.

In certain embodiments, stylus 300 may be used as a passive stylus for purposes of touch detection. As an example and not by way of limitation, the passive stylus may electrically behave like a user's finger when in proximity to a touch sensor, such as touch sensor 10, of a device, such as device 42. In certain embodiments, when stylus 300 is operated as a passive stylus for purposes of touch detection, touch sensor 10 may be able to detect stylus 300 in proximity to touch sensor 10 and determine a location of stylus 300 with respect to touch sensor 10 without any communication between stylus 300 and touch sensor 10 or the device in which touch sensor 10 is located. A touch-sensor controller (e.g., controller 12) of touch sensor 10 may determine that stylus 300 is in proximity to touch sensor 10 and/or a position of stylus 300 with respect to touch sensor 10 via mutual-capacitance measurements and/or self-capacitance measurements. In particular embodiments, regardless of whether one or more of the signal activator inputs 222 of stylus 300 are actuated, controller 12 may detect stylus 300 within proximity of touch sensor 10 via mutual-capacitance measurements and/or self-capacitance measurements. Moreover, controller 12 may track a position of stylus 300 over touch sensor 10 with high precision. As an example and not by way of limitation, controller 12 may track the position of stylus 300 over touch sensor 10 with a position accuracy of approximately 0.2 mm.

As described above, a user may actuate a signal activator input 222 of stylus 300 to cause information to be transmitted by stylus 300 to device 42 via touch sensor 10 of device 42. This capability may supplement the ability of stylus 300 to act as a passive stylus for purposes of touch detection, adding an ability to transmit information for discrete periods of time (e.g., while signal activator input 222 is actuated and/or prior to expiration of a predetermined time period). In certain embodiments, this information may be usable by touch sensor 10 and/or controller 12 to further determine the proximity and/or position of stylus 300 relative to touch sensor 10. In certain embodiments, the information emitted by stylus 300 in response to actuation of signal activator input 222 may provide for or enhance detection of stylus 300 even when stylus 300 is not touching a surface of device 42 (e.g., when stylus 300 is hovering above a surface of device 42). Furthermore, in certain embodiments, actuation of signal activator input 222 (and emission of the resulting signal by stylus 300) may not interfere with the normal touch detection operation of touch sensor 10 of device 42.

In particular embodiments, a passive stylus or semi-active stylus provides certain advantages over an active stylus even though the active stylus may include one or more additional features that may not be provided by a passive stylus or semi-active stylus. As an example and not by way of limitation, relative to an active stylus, a passive stylus (in association with a suitable touch-sensor controller of a device) may be manufactured at a lower cost and designed at a lower complexity. As another example and not by way of limitation, a passive stylus may be relatively easier to implement and/or operate than an active stylus. As another example and not by way of limitation, a passive stylus or semi-active stylus may consume less power than an active stylus. This may allow a non-rechargeable battery to be used for a reasonably lengthy period of time without replacement of the battery or stylus or, in the case of a rechargeable battery, a relatively long period of use time between charges.

As discussed above, in certain embodiments, stylus 300 may be implemented as a passive stylus or a semi-active stylus, while stylus 200 may be implemented as an active stylus. The present disclosure, however, contemplates stylus 300, even when implemented as a passive stylus or semi-active stylus, as including one or more of the additional features shown in FIG. 2, as well as any other suitable features. In certain embodiments, including additional features in stylus 300 may reduce or eliminate one or more of the above-discussed advantages, such as by increasing the manufacturing cost of stylus 300 and/or increasing the power consumption of stylus 300. Additionally, although stylus 300 is primarily described as a passive or semi-active stylus, the present disclosure contemplates a stylus with an exterior similar to stylus 300 being implemented as an active stylus that includes reduced features relative to stylus 200.

Figure 4:
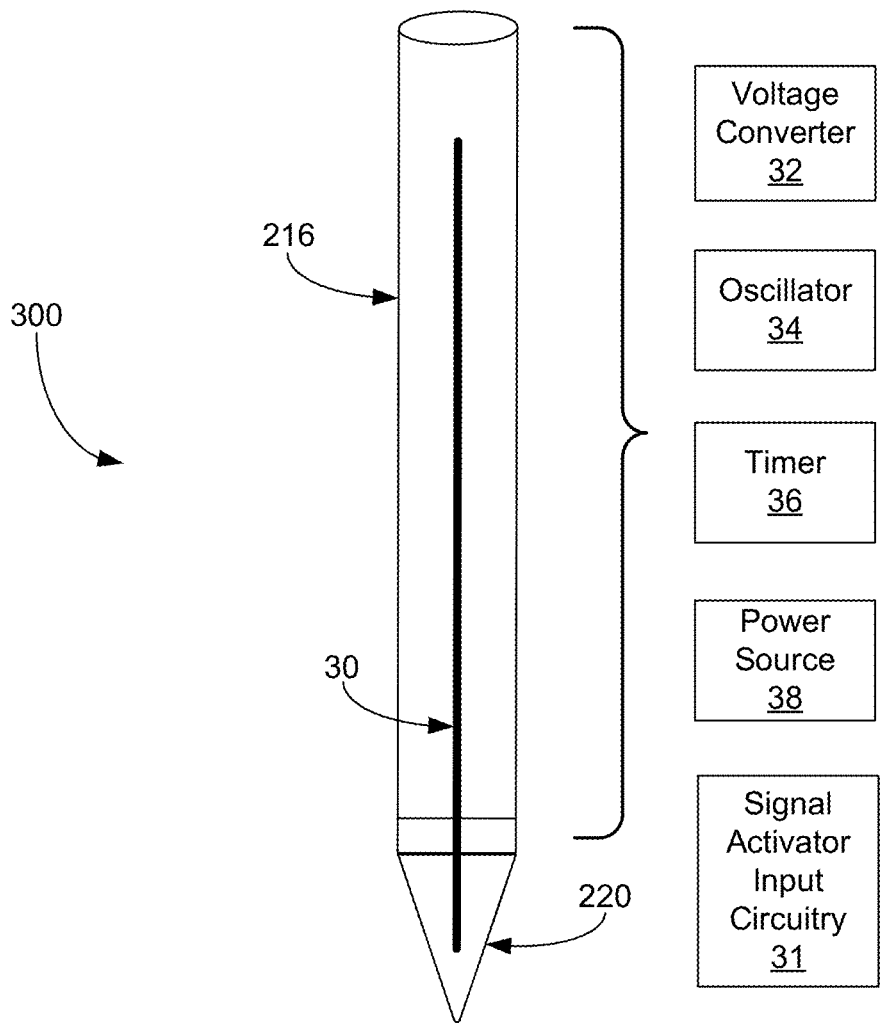
FIG. 4 illustrates an example stylus interior.

FIG. 4 illustrates example internal components of stylus 300. For ease of description, the remainder of this disclosure will refer to these example internal components as being components of stylus 300; however, it should be understood that these components could be internal components of stylus 200, stylus 300, or any other suitable stylus. Stylus 300 may include signal activator input circuitry 31, oscillator 34, power source 38, and voltage converter 32. Accordingly, signal activator input circuitry 31, oscillator 34, power source 38, and voltage converter 32 may form internal components of stylus 300.

In particular embodiments, one or more of the internal components may be configured to facilitate interaction between stylus 300 and device 42 of FIG. 5, between stylus 300 and a user, or between device 42 and the user. In other particular embodiments, one or more of the internal components, in conjunction with one or more of the external components (e.g., signal activator input 222) as described above, may be configured to provide an interaction between stylus 300 and device 42, stylus 300 and the user, or between device 42 and the user. As an example and not by way of limitation, interactions may include communication between stylus 300 and device 42, enabling (or altering) functionality of stylus 300 (or device 42), or providing feedback to (or accepting input from) one or more users. As another example and not by way of limitation, when signal activator input 222 is actuated, stylus 300 may communicate data to device 42 by injecting a suitable low-power and low-frequency electrical signal to device 42 via tip 220. In particular embodiments, the suitable low-power and low-frequency electrical signal may correspond to a low-frequency and high-voltage sinusoid electrical signal. In particular embodiments, the low-frequency and high-voltage sinusoid electrical signal may be detected by touch sensor 10 when tip 220 of stylus 300 is touching a top surface of device 42 or hovering above a top surface of device 42 up to distances of approximately 5 mm to approximately 10 mm away from the top surface of device 42. Although the present disclosure described particular distances, these distances are provided for example purposes only.

Stylus 300 may include signal activator input circuitry 31 for detecting and/or otherwise processing actuations of signal activator input 222. Signal activator input circuitry 31 may be implemented in any suitable manner, according to particular needs. Although described as circuitry, the present disclosure contemplates signal activator input circuitry 31 including any suitable combination of circuitry, mechanical mechanisms, or other components for processing inputs from signal activator input 222. As an example and not by way of limitation, in an example in which signal activator input 222 is implemented as a simple push button, signal activator input circuitry 31 may include a switch mechanism for the push button. As another example and not by way of limitation, in an example in which signal activator input 222 is implemented as a touch screen, signal activator input circuitry 31 may include a touch-sensor controller (e.g., a microcontroller) of the touch screen.

In operation, signal activator input circuitry 31 may detect and/or otherwise facilitate actuation of one or more signal activator inputs 222. In certain embodiments, signal activator input circuitry 31 may communicate or otherwise propagate the detected actuation of signal activator input 222. In certain embodiments, by communicating and/or otherwise propagating the detected actuation of signal activator input 222, signal activator input circuitry 31 may cause or otherwise initiate other components of stylus 300 to perform certain actions, such as those described below.

Stylus 300 may inject electrical signals to one or more conductive rings of tip 220 via center shaft 30. In particular embodiments, center shaft 30 may include one or more galvanic and/or capacitive connections to other portions of stylus 300. In particular embodiments, stylus 300 may be configured to transmit one or more electrical signals detectable by electrodes of touch sensor 10 of device 42. As an example and not by way of limitation, stylus 300 may include voltage converter 32. When stylus 300 detects that signal activator input 222 is actuated, voltage converter 32 may generate a high-voltage electrical power source from the low-voltage output of power source 38. In particular embodiments, the high-voltage electrical power source may be 18V to 24V. Although a particular voltage range is described, the present disclosure contemplates power source 38 have any suitable voltage. In particular embodiments, this high-voltage electrical power source may be used to power oscillator 34 and/or other components of stylus 300 (e.g., timer 36). In particular embodiments, instead of voltage generator 32, it may be desirable to utilize an inductor-capacitor (LC) oscillator, such as oscillator 34 of FIG. 10, to generate the electrical signals (e.g., an oscillating sinusoid wave having peak-to-peak output voltage of approximately 30V) from power source 38 (e.g., a 2.6V battery). Voltage converter 32, such as a high output-voltage and low current boost converter, may generate voltages at low efficiency, such as below approximately 60%. In contrast, a resonance of the LC oscillator may generate oscillating sinusoid waves having voltage amplitudes substantially higher than the low-voltage output of power source 38 and at an efficiency substantially higher than that of voltage converter 32.

Oscillator 34 may toggle the voltage potential of tip 220 between GND voltage and one or more pre-determined voltage levels (for example the high-voltage electrical power source as generated by voltage converter 32). As an example and not by way of limitation, an output of oscillator 34 may include an oscillating sinusoid wave (or any other suitable smooth wave) having a frequency of 16 kHz at 30V, a maximum peak-to-peak output voltage swing of 30V, low-power consumption (for example, less than approximately 180 µA at 20V), and low distortion. As another example and not by way of limitation, oscillator 34 may be a modified Wien bridge oscillator configured to output a 2 kHz sinusoid electrical wave with a peak-to-peak output voltage swing of 15V and a low level of distortion. As yet another example and not by way of limitation, oscillator 34 may output an oscillating sinusoid wave (or any other suitable smooth wave) having a frequency that is substantially between 14 kHz and 16 kHz, and having a maximum peak-to-peak output voltage swing of substantially between 25V and 32V. In particular embodiments, the frequency of the oscillating sinusoid wave is higher than (50 Hz to 60 Hz) line noise and lower than (50 kHz to 100 kHz) switching power supply noise. In particular embodiments, a minimum voltage amplitude of the oscillating sinusoid wave may depend at least on a frequency of the oscillating sinusoid wave and a SNR (e.g., signal-to-noise power ratio) of the oscillating sinusoid wave as received by a touch sensor, such as touch sensor 10. As an example and not by way of limitation, as frequency of the oscillating sinusoid wave doubles, the minimum voltage amplitude of the oscillating sinusoid wave may be halved in order to maintain a signal-to-noise power ratio of the received oscillating sinusoid wave within a pre-determined range, such as for example, greater than or substantially equivalent to 10 decibels (dB). Otherwise, the oscillating sinusoid signal may negatively affect touch measurements of the touch sensor (e.g., the oscillating sinusoid wave may appear as noise). In particular embodiments, it may be desirable for a touch-sensor controller of touch sensor 10 to utilize oversampling for acquiring the oscillating sinusoid wave in order to improve the SNR of the acquired oscillating sinusoid wave.

In particular embodiments, signal activator input 222 may configure oscillator 34 to generate a distinct sinusoid wave of a particular frequency. As an example and not by way of limitation, a first signal activator input 222 may configure oscillator 34 to generate a 1.5 kHz oscillating sinusoid wave and a second signal activator input 222 may configure oscillator 34 to generate a 2 kHz oscillating sinusoid wave. In other particular embodiments, oscillator 34 and its associated components in stylus 300 may be designed such that generation of any sinusoid wave (or any suitable smooth wave) may immediately be halted following the release of signal activator input 222. Furthermore, by modulating the frequency of the sinusoid wave, different data (for example, different tip pressure information) may be transmitted by stylus 300 to device 42. Although this disclosure describes particular electrical signal as particular sinusoid signal, the disclosure contemplates the electrical signal as any suitable smooth wave. As an example and not by way of limitation, the electrical signal may be any smooth wave whose instantaneous rate of change of voltage over time is substantially within suitable limits.

Although this disclosure describes oscillator 34 as an oscillator, this disclosure contemplates stylus 300 including any suitable component for generating a signal and may generically refer to this component as a signal generator.

Power source 38 may be any suitable source of stored energy including but not limited to electrical and chemical-energy sources. Such power source may be suitable for operating stylus 300 without being replaced or recharged for lifetime of stylus 300. Power source 38 may be a plurality of super capacitors, an alkaline battery or a rechargeable battery, or any suitable low-capacity and long-life battery. In particular embodiments, power source 38 may be a 3V battery. When any one of signal activator inputs 222 is pressed, the 3V battery may consume less than 300 µA of current. When none of signal activator inputs 222 are pressed, the 3V battery may consume less than 0.3 µA in order to maintain at least voltage converter 32 in idle mode. In other particular embodiments, stylus 300 may be designed such that the 3V battery consumes substantially negligible current when no signal activator inputs 222 are pressed. As an example and not by way of limitation, the rechargeable battery may be a lithium-ion battery, a nickel-metal-hydride battery. The lithium-ion battery may last for a substantially longer period of time (for example 5-10 years) and may be used to power stylus 300 when one of signal activator inputs 222 is pressed. Power source 38 may also be charged by energy from a user or device 42. As an example and not by way of limitation, power source 38 may be charged by motion induced on stylus 300.

Power source 38 of stylus 300 may also receive power from device 42 or any other suitable external power source. As an example and not by way of limitation, energy may be inductively transferred from device 42 and a power source of device 42 or any other suitable external power source (for example, a wireless power transmitter). As another example and not by way of limitation, power source 38 may be one or more solar cells. Power source 38 may also receive its power by a wired connection through an applicable port coupled to a suitable external power supply. Although this disclosure describes and illustrates particular stylus with particular components having particular implementations, this disclosure contemplates any suitable stylus with any suitable components in any suitable manner having the particular implementations.

In certain embodiments, it may be desirable for power source 38 to include one or more batteries that are not rechargeable. In particular embodiments, such power source 38 may not require replacement for a substantial long period of time. In other words, power source 38 may be freed from maintenance for the useful life of stylus 222. As an example and not by way of limitation, a suitable non-rechargeable battery may be BR322 lithium battery that could last approximately 2 years to approximately 3 years. In particular embodiments, once one or more of the batteries are depleted, one or more signal activator inputs 222 of the stylus 300 may be inoperable. However, stylus 300 may still be functional (e.g., as a passive stylus). As an example and not by way of limitation, touch-sensor controller 12 of touch sensor 10 may continue to detect stylus 300 within proximity of touch sensor 10, Furthermore, touch-sensor controller 12 may continue to determine a proximity distance of stylus 300 from touch sensor 10 and/or a position of stylus 300 relative to touch sensor 10.

In particular embodiments, it may be more desirable for power source 38 to include one or more rechargeable batteries (or super capacitors) that could be quickly recharged. Furthermore, power source 38 may consume relatively low power (for example, low current) as described above. Although the disclosure describes and illustrates particular power sources, the disclosure contemplates any suitable power sources in any suitable manner. Moreover, although the disclosure describes and illustrates particular power sources for particular stylus 300 having particular signal activator inputs 222, the disclosure contemplates any suitable power sources for any suitable stylus having any suitable number of any suitable signal activator input.

In particular embodiments, power source 38 of stylus 300 may have different requirements for power consumption based at least on whether power source 38 is rechargeable (or replaceable) or non-rechargeable (or non-replaceable). Referencing rechargeable (or replaceable) power source 38, stylus 300 may consume less than approximately 200 µA to approximately 400 µA when one or more of the signal activator inputs 222 are actuated. In contrast, stylus 300 may consume less than approximately 10 µA when none of the signal activator inputs 222 are actuated. Furthermore, power source 38 may last at least 24 hours between charges (e.g., at least 24 hours before requiring next recharge). In particular embodiments, if power source 38 includes one or more super capacitors, the super capacitors may be recharged within a few seconds. Referencing non-rechargeable (or non-replaceable) power source 38, stylus 300 may consume approximately 0 µA when none of the signal activator inputs 222 are actuated. Furthermore, stylus 300 may consume minimal current when oscillator 34 is enabled. As an example and not by way of limitation, stylus 300 may consume approximately 190 µA when oscillator 34 is generating a stylus signal.

Although the disclosure describes particular requirements for power consumption of particular power sources by a particular stylus 300 having particular signal activator inputs 222, the disclosure contemplates any suitable requirements for power consumption of any suitable power sources by any suitable stylus 300 having any suitable number of any suitable signal activator inputs 222.

In particular embodiments, it may be desirable for stylus 300 to include timer 36. Accordingly, timer 36 may allow stylus 300 to conserve energy by disabling generation of a signal (e.g., a low-frequency and high-voltage signal) if one or more of the signal activator inputs 222 are actuated longer than a pre-determined threshold duration. As an example and not by way of limitation, timer 36 may allow stylus 300 to disable oscillator 34 for generating a low-frequency and high-voltage signal if signal activator input 222 of the passive stylus is pressed longer than approximately 10 s to approximately 20 s. In particular embodiments, such disabling of oscillator 34 may decrease power consumption by stylus 300 to less than approximately 1 µA. Although the disclosure describes and illustrates particular timer of a particular stylus 300, the disclosure contemplates any suitable timer of any suitable stylus. Furthermore, although the disclosure describes and illustrates particular timer for allowing a particular stylus 300 having particular signal activator inputs 222 to conserve energy, the disclosure contemplates any suitable timer for allowing any suitable stylus having any suitable number of any suitable signal activator input to conserve energy in any suitable manner.

FIG. 5 illustrates stylus 200/300 with device 42. Device 42 may be a touch screen. Device 42 may have a display (not shown) and a touch sensor 10 with a touch-sensitive area 40. The display may be a liquid crystal display (LCD), a light-emitting diode (LED) display, a LED-backlight LCD, or other suitable display. Furthermore, the display may be visible through a cover panel and one or more substrates (with the drive and sense electrodes that are disposed on the one or more substrates) of device 42. Although this disclosure describes and illustrates particular display with particular touch sensor, this disclosure contemplates any suitable display with any suitable touch sensor.

Device 42 may include electronics that provide one or more functionalities. As an example and not by way of limitation, device 42 may include circuitry or any other suitable electronics for wireless communication to or from device 42, executing programs on device 42, generating graphical or other user interfaces (UIs) for device 42 to display to a user, managing power to device 42 from a battery or other suitable power sources, recording multimedia content, any other suitable functionality, or any suitable combination of these. Although this disclosure describes and illustrates particular electronics of particular touch-sensing device providing particular functionalities, this disclosure contemplates any suitable electronics of any suitable touch-sensing device providing any suitable functionalities.

A stylus and device 42 may be synchronized prior to communication of data between the stylus and device 42. This may be particularly applicable to an active stylus, such as stylus 200. As an example and not by way of limitation, stylus 200 may be synchronized to device 42 through a pre-determined bit sequence transmitted by touch sensor 10 of device 42. As another example and not by way of limitation, stylus 200 may be synchronized to device 42 by processing a drive signal transmitted by one or more electrodes of touch sensor 10 of device 42. As yet another example and not by way of limitation, stylus 200 may be synchronized to device 42 through a pre-determined bit sequence transmitted by stylus 200.

Stylus 200/300 may also interact or communicate with device 42 when it is brought in contact with or in proximity to touch-sensitive area 40 of touch sensor 10. Such interaction between stylus 200/300 and device 42 may be capacitive, inductive, or conductive. In the case of stylus 300, for example, such interaction may include signals generated and emitted by stylus 300 in response to stylus 300 detecting actuation of signal activator input 222. When stylus 200/300 is bought in contact with or in the proximity of touch-sensitive area 40 of touch sensor 10, signals generated by stylus 200/300 may influence capacitive nodes within touch-sensitive area 40. Although this disclosure describes and illustrates particular interactions between particular stylus and particular touch-sensing device via particular means, this disclosure contemplates any suitable interactions between any suitable stylus and any suitable touch-sensing device via any suitable means.

Interaction between stylus 200/300 and device 42 may occur when stylus 300 is contacting or in proximity to device 42. As an example and not by way of limitation, a user may perform a gesture or sequence of gestures, such as pressing one or more signal activator inputs 222, while stylus 300 is hovering above touch-sensitive area 40 of device 42. Based on the one or more signal activator inputs 222 being pressed, stylus 300 may interact with device 42 to initiate a pre-determined function. In certain embodiments, the pre-determined function may be authenticating a user associated with stylus 300 or device 42. The pre-determined function may even initiate a particular job function of device 42. Although this disclosure describes and illustrates particular interactions between particular stylus and particular touch-sensing device, this disclosure contemplates any suitable interactions in any suitable manner.

Figure 6A:
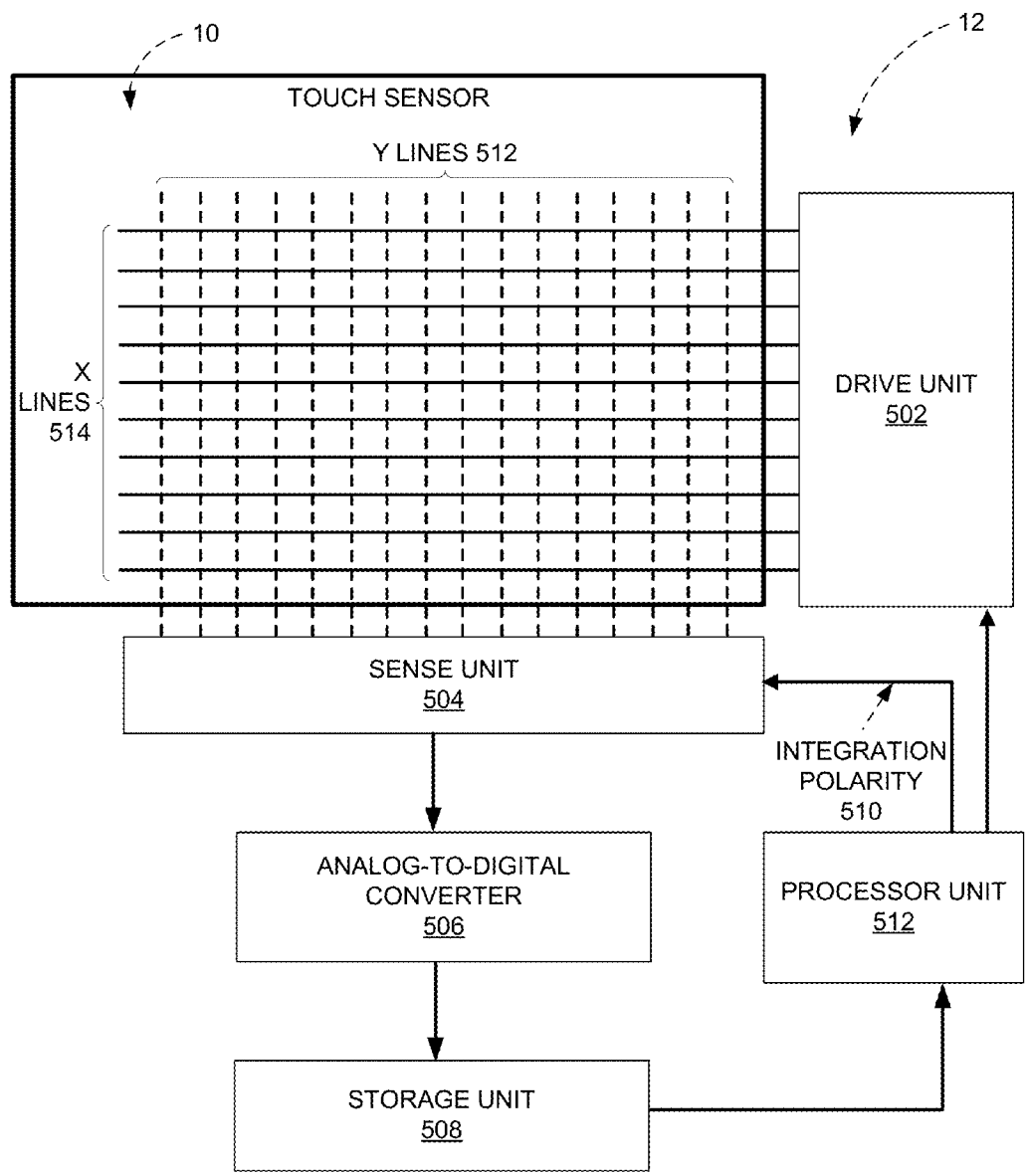
FIG. 6A illustrates an example touch-sensor controller configured for mutual-capacitance measurement.

FIG. 6A illustrates touch sensor 10 and touch-sensor controller 12 of device 42 configured for mutual-capacitance measurement. Touch sensor controller 12 may include touch sensor 10, drive unit 502, sense unit 504, analog-to-digital converter (ADC) 506, storage unit 508, and processor unit 512. Herein, reference to touch-sensor controller may comprise one or more of a touch sensor, one or more of a drive unit, one or more of a sense unit, one or more of an ADC, one or more of a storage unit, and one or more of a processor unit where appropriate. Accordingly, touch sensor 10, drive unit 502, sense unit 504, ADC 506, storage unit 508, and processor unit 512 may form internal components of touch-sensor controller 12.

Touch sensor 10 may include an array of drive and sense electrodes (or an array of electrodes of a single type) as described above. Furthermore, touch sensor 10 may include a plurality of X lines 514 and a plurality of Y lines 512. X lines 514 form the drive electrode lines of touch sensor 10 as described above. Herein, reference to X lines 514 may encompass drive electrode lines, and vice versa, where appropriate. Similarly, Y lines 512 form the corresponding sense electrode lines of touch sensor 10 as described above. Herein, reference to Y lines 512 may encompass sense electrode lines, and vice versa, where appropriate.

In particular embodiments, one or more of the internal components may be configured to provide an interaction between device 42 and stylus 200/300 or between device 42 and user. As an example and not by way of limitation, interactions may include communication between device 42 and stylus 200/300, enabling functionality of device 42 (or stylus 200), or providing feedback to (or accepting input from) one or more users. As another example and not by way of limitation, processor unit 512 may be configured to measure signals produced by Y lines 512 to extract any data as embedded within the signals. In particular embodiments, such signals may be sense signals that are initiated by drive signals being applied to the corresponding X lines 514 by drive unit 502. Such drive signals generate electric field extending from the X lines 514 to the corresponding Y lines 512. Accordingly, the electric field may produce corresponding sense signals in the Y lines 512. As an example and not by way of limitation, when drive unit 502 applies a rising voltage signal (for example, a voltage signal that transitions from a logic-low voltage to a logic-high voltage) to one of X lines 514, a positive spike of sense signal may be generated on a corresponding sense electrode line of Y lines 512. As another example and not by way of limitation, when drive unit 502 applies a falling voltage signal (for example, a voltage signal that transitions from a logic-high voltage to a logic-low voltage) to one of X lines 514, a negative spike of sense signal may be generated on a corresponding sense electrode line of Y lines 512. In particular embodiments, the signals produced by Y lines 512, such as Y lines 512 located under a tip of stylus 200/300, may be injected synchronously by stylus 200/300.

In particular embodiments, touch-sensor controller 12 may sequentially pulse X lines 514 and measure the response received over Y lines 512. Accordingly, touch-sensor controller 12, utilizing mutual-capacitance measurements, may yield a two-dimensional array of measured sense signals where each cell of the two-dimensional array represents a measured capacitance between corresponding X line 514 and Y line 512 of touch sensor 10. In particular embodiments, touch-sensor controller 12 may determine a position of any capacitive object within proximity of touch sensor 10 by processing data of the two-dimensional array. Herein, reference to a capacitive object may encompass any object that causes a suitable change in mutual-capacitance and/or a self-capacitance of one or more electrodes of a touch sensor, where appropriate.

Although this disclosure describes and illustrates particular components of particular touch-sensor controller for performing capacitance measurements in particular manner, this disclosure contemplates any combination of one or more suitable components of any suitable touch-sensor controller for performing capacitance measurements in any suitable manner. As an example and not by way of limitation, touch-sensor controller 12 and touch sensor 10 may implement self-capacitance measurement.

In particular embodiments, signals produced by Y lines 512 may be initiated by a third-party sinusoid electrical signal. The third-party sinusoid electrical signals may oscillate at a frequency that is substantially lower than the acquisition frequency utilized by sense unit 504 to acquire signals from Y lines 512. As an example and not by way of limitation, an acquisition frequency of sense unit 504 may substantially be between 100 kHz and 120 kHz. As an example and not by way of limitation, the third-party sinusoid electrical signal may be power-line noise of low-frequency (for example, 50 Hz to 60 Hz) and high-voltage (for example, above 200V). As another example and not by way of limitation, the third-party sinusoid electrical signal may be a low-frequency electrical oscillating signal injected by stylus 200/300 of FIGS. 2-3, as described above.

In particular embodiments, the low-frequency electrical oscillating signal may operate at a frequency that is higher than frequency of the power-line noise (as described above) and lower than acquisition frequency of sense unit 504. As an example and not by way of limitation, the low-frequency electrical oscillating signal may operate at a frequency that is approximately 16 kHz while the acquisition frequency of sense unit 504 may be between approximately 100 kHz and approximately 120 kHz. As another example and not by way of limitation, the acquisition frequency of sense unit 504 may be approximately five to eight times a frequency of the low-frequency electrical oscillating signal.

When voltage amplitude of the third-party sinusoid electrical signal exceeds 200V, the charge injected by the third-party sinusoid electrical signal into touch sensor 10 may envelop the real sense signals produced by Y lines 512. As such, the accuracy of measurement by touch-sensor controller 12 may be affected. Even when voltage amplitude of the third-party sinusoid electrical signal is relatively high (for example, 20V to 40V), the charge injected into touch sensor 10 may be substantially higher than any normal environmental noise captured by touch sensor 10. In other words, the third-party sinusoid electrical signal may have a substantial signal footprint, even in the presence of environmental noise.

In contrast, when frequency of the third-party sinusoid electrical signal is substantially lower than the acquisition frequency of sense unit 504, the third-party sinusoid electrical signal may not substantially affect the measurement accuracy and performance of the touch-sensor controller 12. As an example and not by way of limitation, linearity and position jitter as associated with touch and proximity measurements by touch-sensor controller 12 remain substantially unchanged. As such, touch-sensor controller 12 may continue to detect and measure the proximity of any objects substantially close to touch sensor 10, even in the presence of one or more high-voltage and low-frequency third-party sinusoid electrical signals.

However, the third-party sinusoid electrical signals may further modulate signals on Y lines 512 as the signals are being acquired by sense unit 504. In particular embodiments, the extent of modulation may depend at least on the amount of charge being transferred from the power-line and/or stylus 200/300, the time at which the signals on Y lines 512 are being acquired by sense unit 504, and the duration of acquisition. Although this disclosure describes a third-party signal as particular sinusoid signal, the disclosure contemplates the third-party signal as any suitable smooth wave. As an example and not by way of limitation, the third-party signal may be any smooth wave whose instantaneous rate of change of voltage over time is substantially within suitable limits.

In particular embodiments, sense unit 504 may be configured to reverse the polarity of sense signal as measured by sense unit 504. As an example of FIG. 6A and not by way of limitation, sense unit 504 may receive an indication from processor unit 512 via integration polarity 510 whether to reverse polarity of a sense signal as acquired by sense unit 504 at a time instance. As an example of FIG. 7, described below, and not by way of limitation, sense unit 504 acquires sense signal S at time instance $t_{00}$ when integration polarity 510 is positive. As another example of FIG. 7 and not by way of limitation, sense unit 504 acquires sense signal −S at time instance $t_{10}$ when integration polarity 510 is negative. Although this disclosure describes and illustrates particular touch-sensor controller measuring particular sense signals of particular touch sensor by utilizing particular components in a particular manner, this disclosure contemplates the touch-sensor controller measuring any suitable sense signals of the touch sensor by utilizing one or more of any suitable component in any suitable manner.

In particular embodiments, touch-sensor controller 12 may include an ADC 506 to convert analog signals as received from sense unit 504 into corresponding digital signals. The digital units may be stored in storage unit 508 for further post-processing by at least processor unit 512. As an example of FIG. 7, described below, and not by way of limitation, storage unit 508 may store digital form of actual-measured signal S+N1 as measured from sense unit 504 at time instance $t_{00}$ and store digital form of actual-measured signal −S+N2 as measured from sense unit 504 at time instance $t_{10}$ for further processing by processor unit 512. In particular embodiments, storage unit 508 may include a random access memory (RAM) or other suitable storage element for storing the normal (for example, sense signal S) and reversed (for example, sense signal −S) measured signals. Although this disclosure describes and illustrates particular components for storing signals as acquired from particular touch sensor in digital domain, this disclosure contemplates any combination of one or more suitable components for storing signals as acquired from the touch sensor in any suitable manner. As an example and not by way of limitation, the signals as acquired from touch sensor 10 may be stored in internal capacitors residing within touch-sensor controller 12. Furthermore, although this disclosure describes and illustrates particular storage unit, the disclosure contemplates any suitable storage unit.

In particular embodiments, processor unit 512 may include logic to perform dual-measurement. As an example of dual-measurement in the digital domain and not by way of limitation, processor unit 512 may configure sense unit 504 to acquire signals from Y lines 512 of touch sensor 10 at a first time instance and at a second time instance that immediately succeeds the first time instance. The second time instance may be substantially close to the first time instance such that overall acquisition frequency of sense unit 504 may be substantially much higher than the frequency of any third-party sinusoid electrical signal as described above. In addition, processor unit 512 may configure sense unit 504 to reverse the polarity of the acquired signal at the second time instance, as described above.

Next, processor unit 512 may retrieve both normal (a.k.a. acquired signal at first time instance) measured signal and inverted (a.k.a. acquired signal at second time instance whose polarity has been reversed) measured signal from storage unit 508 and apply one or more post-processing algorithms to both signals. As an example of a post-processing algorithm and not by way of limitation, processor unit 512 may digitally add both normal and inverted measured signals. As another example of a post-processing algorithm and not by way of limitation, processor unit 512 may digitally subtract the inverted measured signal from the normal measured signal.

Although this disclosure describes and illustrates particular components of particular touch-sensor controller for performing dual-measurement in particular manner, this disclosure contemplates any combination of one or more suitable components of any suitable touch-sensor controller for performing dual-measurement in any suitable manner. As an example and not by way of limitation, dual-measurement may be performed in the analog domain. Accordingly, sense unit 504 may include one or more integrator circuits for acquiring signals from touch sensor 10. In addition, sense unit 504 may reverse the polarity of signal as acquired during second time instance by reversing the polarity of the integrator circuit associated with the acquisition of the signal. Furthermore, the post-processing algorithms as described above may be performed by utilizing one or more integrator circuits and changing the polarity of one or more suitable integrator circuits. As an alternate means for reversing polarity of acquired signals in the analog domain, sense unit 504 may measure sense signals in response to positive and negative edges of drive signals as applied by drive unit 502 to one or more corresponding X lines 514 of touch sensor 10.

In particular embodiments, processor unit 512 may include logic to perform a single measurement. As an example of a single measurement in the digital domain and not by way of limitation, processor unit 512 may configure sense unit 504 to acquire signals from Y lines 512 of touch sensor 10 at the first time instance and at the second time instance. In contrast to dual measurement, polarity of the acquired signal at the second time instance may not be reversed by processor unit 512. Next, processor unit 512 may retrieve both measured signals as acquired from storage unit 508 and apply one or more post-processing algorithms to both signals. As an example of a post-processing algorithm and not by way of limitation, processor unit 512 may digitally apply one or more Fourier synthesis to at least both measured signals to detect and retrieve any suitable data as embedded within the measured signals. Although this disclosure describes and illustrates particular components of particular touch-sensor controller for performing single-measurement in particular manner, this disclosure contemplates any combination of one or more suitable components of any suitable touch-sensor controller for performing single-measurement in any suitable manner.

Figure 6B:
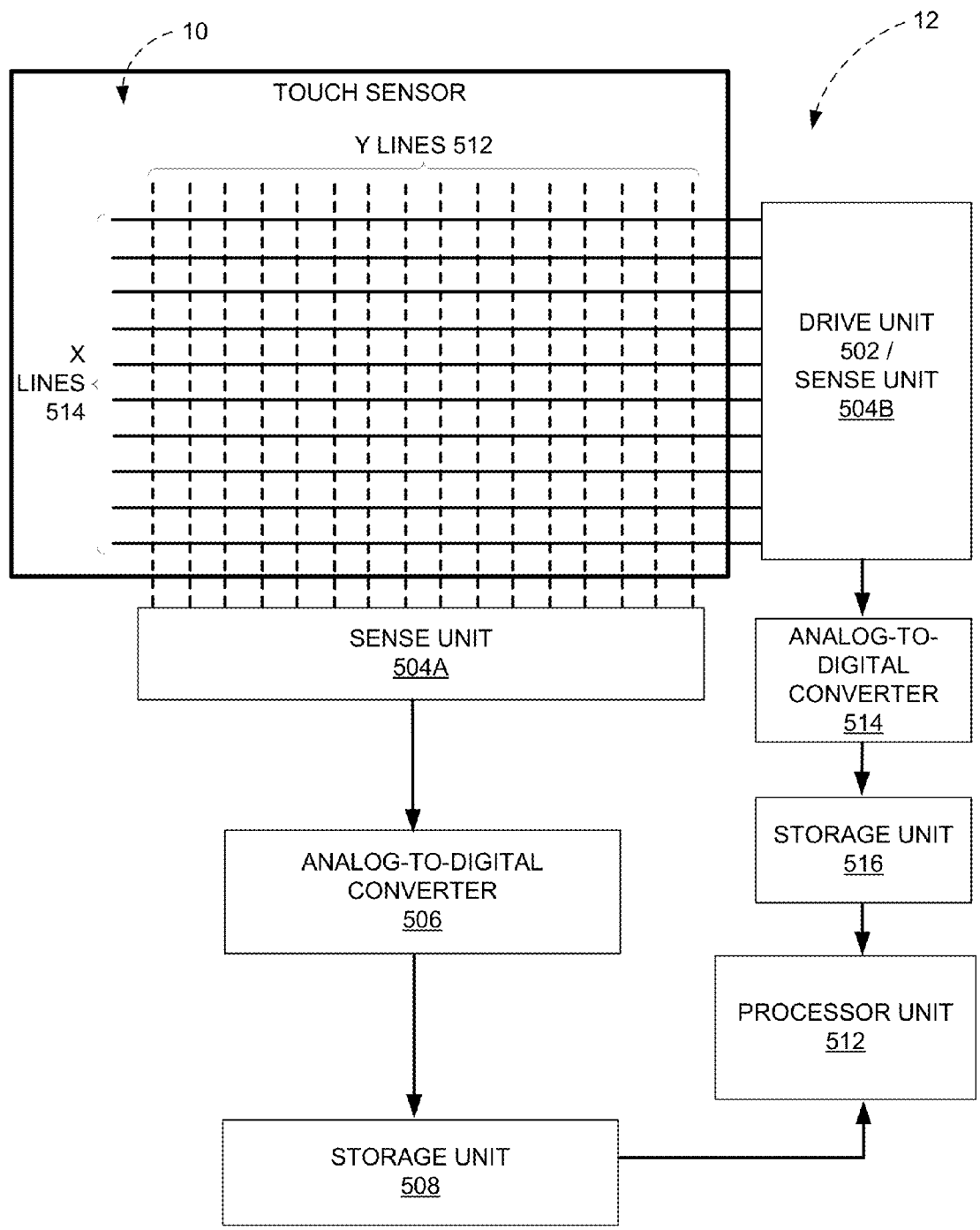
FIG. 6B illustrates an example touch-sensor controller configured for dedicated stylus measurement.

FIG. 6B illustrates touch sensor 10 and touch-sensor controller 12 of device 42 configured for dedicated stylus measurement. Reference to dedicated stylus measurement may encompass dedicated stylus acquisition, or vice-versa, where appropriate. In the example of FIG. 6B, touch-sensor controller 12 may include touch sensor 10, drive unit 502 (or sense unit 504B), sense unit 504A, ADC 506, ADC 514, storage unit 508, storage unit 516, and processor unit 512.

In particular embodiments, it may be desirable for touch-sensor controller 12 to configure touch sensor 10 as a receiver dedicated to perform dual-measurements as described above. As an example and not by way of limitation, touch sensor 10 may be dedicated to receive one or more high-voltage and low-frequency third-party sinusoid electrical signals generated from stylus 300. Accordingly, touch-sensor controller 12 may configure X lines 514 (in addition to Y lines 512) to sense the third-party sinusoid electrical signals generated by stylus 300. Furthermore, touch-sensor controller 12 may configure drive unit 502 to acquire signals from X lines 514. As an example and not by way of limitation, touch-sensor controller 12 may configure drive unit 502 as sense unit 504B to acquire signals from X Lines 514. As such, X lines 514 and Y lines 512 of touch sensor 10 may become sense electrode lines dedicated for acquiring the signals from touch sensor 10.

In particular embodiments, in addition to configuring drive unit 502 as sense unit 504B to acquire signals from X lines 514, touch-sensor controller 12 may utilize ADC 514 to convert the signals acquired from X lines 514 to digital samples. Furthermore, touch-sensor controller 12 may temporarily store the digital samples using storage unit 516 before sending them for further post-processing by processor unit 512.

In particular embodiments, processor unit 512 may perform dual-measurements on digital samples corresponding to signals acquired from Y lines 512 and digital samples corresponding to signals acquired from X lines 514. As an example and not by way of limitation, touch-sensor controller 12 may configure drive unit 502 (or sense unit 504B) to acquire stylus signals associated with the third-party sinusoid electrical signals at a first time instance and at a second succeeding time instance. Herein, reference to acquiring a stylus signal at a particular time instance may encompass the stylus initiating the acquiring of the stylus signal at that particular time instance and for a pre-determined duration of time beginning with the particular time instance, or vice-versa, where appropriate.

Furthermore, touch-sensor controller 12 may reverse a polarity of the stylus signal being acquired at the second time instance. Thereafter, processor unit 512 may subtract the inverted (i.e., reversed) stylus signal acquired at the second time instance from the non-inverted (i.e., normal) stylus signal acquired at the first time instance. As such, touch-sensor controller 12 may suppress some or all environmental noise (for example, line noise and/or switching power supply noise) and retrieve the stylus signal corresponding to the third-party sinusoid electrical signals.

In particular embodiments, touch-sensor controller 12 may perform dedicated stylus measurements to detect a state of a signal activator input of stylus 300, where stylus 300 may be a passive stylus having one or more signal activator inputs 222. When signal activator input 222 is actuated (e.g., signal activator input 222 is pressed), stylus 300 may generate and emit a high-voltage sinusoid wave signal (e.g., approximately 30V and approximately 16 kHz) and transmit the high-voltage sinusoid wave signal to touch sensor 10 via tip 220 of stylus 300. Touch-sensor controller 12 may measure the high-voltage sinusoid wave signal injected by tip 220 based on dedicated stylus measurements as described above. Moreover, in certain embodiments, electrode lines (X lines 514 and Y lines 512) of touch sensor 10 may be configured to detect and receive the injected high-voltage sinusoid wave signal.

During the dedicated stylus measurements, the individual ADC samples corresponding to the generated high-voltage sinusoid wave signal may be captured and accumulated into a memory of touch-sensor controller 12 (for example, storage unit 508 and storage unit 516) for further processing. As an example and not by way of limitation, processor unit 512 may apply a frequency sensitive algorithm (for example, Goertzel algorithm) to determine one or more frequency components (for example, frequency tones) and their associated strengths (for example, amplitudes) of the individual ADC samples along a first coordinate axis (for example, X axis) corresponding to X lines 514 and a second coordinate axis (for example, Y axis) corresponding to Y lines 512. By analyzing data corresponding to the frequency components and their associated strengths along the first and second coordinate axis, touch-sensor controller 12 may determine a proximity of stylus 300 from touch sensor 10 and/or a position of the passive stylus's projection on to touch sensor 10.

In particular embodiments, touch-sensor controller 12 may not have adequate computing resources to simultaneously measure all X lines 514 and Y lines 512. As an example and not by way of limitation, a memory capacity of storage unit 508 and/or storage unit 516 may be inadequate to process all the measurements retrieved from X lines 514 and Y lines 512 in one pass. Accordingly, touch-sensor controller 12 may simultaneously measure all X lines 514 and Y lines 512 in one or more passes.

Although this disclosure describes and illustrates particular dedicated stylus measurements, the disclosure contemplates any suitable dedicated stylus measurements in any suitable manner. Moreover, although this disclosure describes and illustrates particular components of touch-sensor controller 12 for dedicated stylus measurements, the disclosure contemplates any suitable combination of one or more of any suitable component of touch-sensor controller 12 for dedicated stylus measurements in any suitable manner. Furthermore, although this disclosure describes and illustrates touch-sensor controller 12 performing dedicated stylus measurements for particular stylus having particular signal activator inputs 222, the disclosure contemplates touch-sensor controller 12 performing dedicated stylus measurements for any suitable stylus having any suitable signal activator inputs 222 in any suitable manner.

Figure 7:
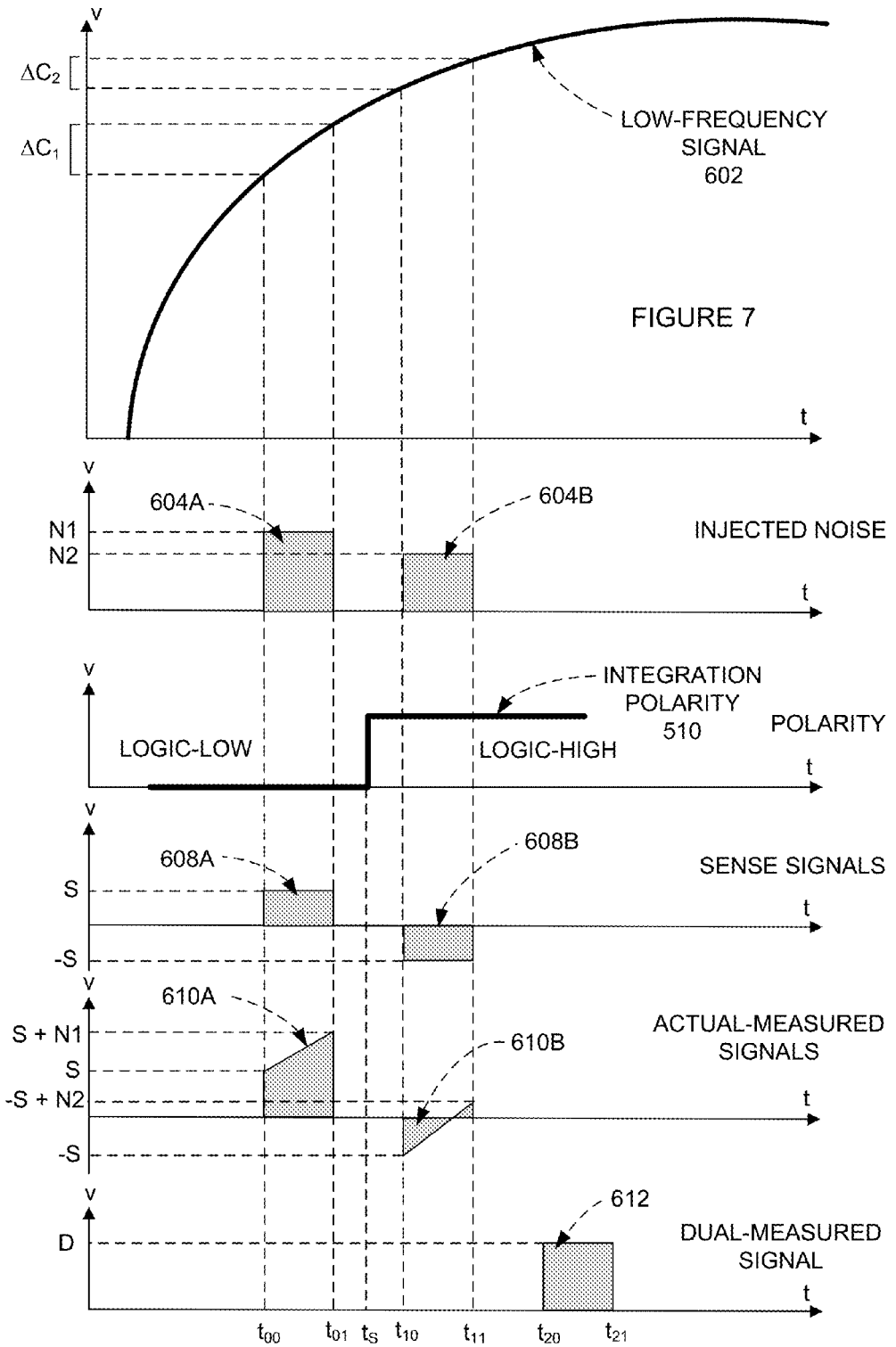
FIG. 7 illustrates example signals of touch-sensor controller of FIGS. 6A-6B during an example dual-measurement cycle or an example dedicated stylus measurement cycle.

FIG. 7 (not necessarily shown to scale) illustrates example ideal signals of touch-sensor controller 12 of FIGS. 6A-6B during an example dual-measurement cycle or an example dedicated stylus measurement cycle. As an example of FIG. 7 and not by way of limitation, low-frequency signal 602 may be injected by stylus 300 onto touch sensor 10. In particular embodiments, low-frequency signal 602 may be a third-party sinusoid electrical signal of high-voltage and low-frequency as described above. In particular embodiments, low-frequency signal 602 may be third-party noise.

At time instance $t_{00}$, sense unit 504 may be configured by processor unit 512 to acquire from one of Y lines 512 sense signal 608A of magnitude S as illustrated by graph sense signals of FIG. 7. As an example of mutual-capacitance implementation and not by way of limitation, sense signal 608A may be produced at least in part by drive signal being applied by drive unit 502 to one or more corresponding X lines 514 of touch sensor 10. During the period of acquisition (for example, period $t_{00}$-$t_{01}$ as illustrated in FIG. 7), signal 602 changes. As an example of FIG. 7 and not by way of limitation, a magnitude delta of $\Delta C_1$ with low-frequency signal 602 may produce injected signal 604A of magnitude N1 that is acquired by sense unit 504 during acquisition period $t_{00}$-$t_{01}$. As such, an actual-measured signal 610A of magnitude S+N1 may be measured by sense unit 504 at time instance $t_{01}$. In particular embodiments, the acquisition period $t_{00}$-$t_{01}$ may be substantially smaller than the reciprocal of the acquisition frequency of touch sensor 10. As an example and not by way of limitation, the acquisition period $t_{00}$-$t_{01}$ may substantially be between 0.5 μs and 3.0 μs. In particular embodiments, a duration of acquisition period $t_{00}$-$t_{01}$ may depend on a type of low-frequency signal 602.

As an example and not by way of limitation, if low-frequency signal 602 corresponds to an undesirable noise signal, such as a line noise, the duration may be configured by touch-sensor controller 12 to be below a pre-determined threshold duration. In contrast, if low-frequency signal 602 corresponds to a desirable stylus signal, such as an oscillation sinusoid wave injected by stylus 300, the duration may be configured by touch-sensor controller 12 to be higher than the pre-determined threshold duration. Similarly at time instance $t_{10}$, sense unit 504 may be configured by processor unit 512 to acquire sense signal from the same sense electrode line (as with earlier acquisition) of touch sensor 10.

In particular embodiments, time instances $t_{00}$ and $t_{10}$ may be determined at least by a frequency (a.k.a. acquisition frequency) by which sense signal is being acquired from touch sensor 10 by sense unit 504. As an example and not by way of limitation, the time difference between time instances $t_{00}$ and $t_{10}$ may substantially be between 1.5 μs and 8.0 μs. As another example and not by way of limitation, the time difference between two consecutive acquisitions of the sense signal (for example, time difference between time instances $t_{00}$ and $t_{10}$) is approximately 3 μs to approximately 10 μs.

In addition, sense unit 504 may be configured by processor unit 512 via integration polarity 510 to reverse polarity of the acquired sense signal. As an example of graph polarity in FIG. 7 and not by way of limitation, integration polarity 510 may reverse from positive to negative between time instances $t_{01}$ and $t_{10}$ (such as for example at time instance $t_s$) as an indication to sense unit 504 to reverse polarity of sense signal as acquired at time instance $t_{10}$. As such, sense unit 504 acquires sense signal 608B of magnitude −S at time instance $t_{10}$. As with earlier acquisition, during the latest period of acquisition (for example, period $t_{10}$-$t_{11}$ as illustrated in FIG. 7) signal 602 changes.

As an example of FIG. 7 and not by way of limitation, a magnitude delta of $\Delta C_2$ with low-frequency signal 602 may produce injected signal 604B of magnitude N2 that is acquired by sense unit 504 during acquisition period $t_{00}$-$t_{11}$. As such, an actual-measured signal 610B of magnitude −S+N2 may be measured by sense unit 504 at time instance $t_{11}$. Similarly, acquisition period $t_{10}$-$t_{11}$ may be substantially smaller than the reciprocal of the acquisition frequency of touch sensor 10. As with acquisition period $t_{00}$-$t_{01}$, the acquisition period $t_{10}$-$t_{11f}$ may substantially be between 0.5 μs and 3.0 μs.

In particular embodiments, the difference in magnitudes N1 and N2 may depend at least on the frequency by which signals are acquired from touch sensor 10 by sense unit 504. As an example of FIG. 7 and not by way of limitation, as the acquisition frequency of sense unit 504 increases, the difference in time between time instance $t_{00}$ and $t_{10}$ reduces. When acquisitions of actual-measured signals 610A-610B by sense unit 504 at time instances $t_{00}$ and $t_{10}$ are configured to be close to each other, corresponding $\Delta C_1$ and $\Delta C_2$ of low-frequency signal 602 may be substantially similar. Accordingly, magnitude N1 may be substantially similar to magnitude N2. In contrast, when acquisitions of actual-measured signals 610A-610B by sense unit 504 at time instances $t_{00}$ and $t_{10}$ are configured to be further apart, corresponding $\Delta C_1$ and $\Delta C_2$ by low-frequency signal 602 may be substantially different. Accordingly, magnitude N2 may be substantially different from magnitude N1. In particular embodiments, both magnitudes N1 and N2 may have the same polarity. When acquisition frequency of sense unit 504 is substantially higher than that of low-frequency signal 602, polarities of both $\Delta C_1$ and $\Delta C_2$ may be the same. Accordingly, both magnitudes N1 and N2 may have the same polarity.

Although the disclosure describes and illustrates particular injected signals 604A-604B as produced by low-frequency signal 602, the disclosure contemplates any suitable injected signals as produced by any suitable low-frequency signal. Moreover, although this disclosure describes and illustrates particular sense signals 608A-608B as acquired by sense unit 504, the disclosure contemplates any suitable sense signals as acquired by any suitable sense unit.

As an example of FIGS. 6A-6B and 7 and not by way of limitation, processor unit 512 may include logic to retrieve actual-measured signals 610A-610B from storage unit 508 and apply one or more post-processing algorithms to both signals to produce dual-measured signal 612 of magnitude D at time instance $t_{20}$. As an example of a post-processing algorithm and not by way of limitation, processor unit 512 may digitally add both actual-measured signals 610A-610B to generate dual-measured signal 612 of magnitude (e.g., D of FIG. 7) N1+N2 at time instance $t_{20}$. As such, adding both actual-measured signals as described above may suppress any sense signals 608A-608B. Given that sense signals 608A-608B may be utilized by touch-sensor controller 12 to detect and measure one or more touch events that are associated with proximity of any object to touch sensor 10, adding both actual-measured signals as described may be used to suppress the touch events.

As another example of post-processing algorithm and not by way of limitation, processor unit 512 may digitally subtract actual-measured signal 610B from actual-measured signal 610A to generate dual-measured signal 612 of magnitude (for example, D of FIG. 7) 2S+N1−N2. If magnitudes N1 and N2 are substantially similar, D may substantially approximate 2S. As such, subtracting actual-measured signal 610B from actual-measured signal 610A suppresses the effect of low-frequency signal 602 on touch sensor 10 and doubles sense signal 608A/B. This may make touch-sensor controller 12 more sensitive to sense signals as generated by Y lines 512. In particular embodiments, it may be desirable to suppress the effect of low-frequency signal 602 on actual-measured signals 610A-610B as low-frequency signal 602 may generate noise causing substantial position jitters in the measured proximity of stylus 300 from touch sensor 10.

Although this disclosure describes and illustrates particular components of particular touch-sensor controller for performing dual-measurement in a particular sequence at particular time instances, the disclosure contemplates any suitable combination of one or more suitable components of any suitable touch-sensor controller performing dual-measurement in any suitable order and at any suitable time instances. Furthermore, although this disclosure describes and illustrates particular waveforms and signals for dual-measurement by particular touch-sensor controller in particular order and in particular manner, this disclosure contemplates any suitable combination of one or more of a suitable waveform and one or more of a suitable signal for dual-measurement by any suitable touch-sensor controller in any suitable order and in any suitable manner.

In particular embodiments, at time instances $t_{00}$ and $t_{01}$, touch-sensor controller 12 may acquire sense signals 608A and 608B via drive unit 502 and/or sense unit 504. As an example and not by way of limitation, drive unit 502 and/or sense unit 504 may measure and acquire sense signals 608A and 608B from corresponding X lines 514 and/or Y lines 512 via self-capacitance measurements. During both periods of acquisitions (i.e., $t_{00}$-$t_{01}$ and $t_{10}$-$t_{11}$), sense signals 608A-

608B may be modulated by low-frequency signal 602 as described above. Furthermore, sense signal 608B may be inverted by associated drive unit 502 or sense unit 504 as described above.

In particular embodiments, processor unit 512 may digitally add both actual-measured signals 610A and 610B to suppress touch signals (i.e., sense signals 608A-608B) and retrieve signals N1 and N2 injected by low-frequency signal 602. In particular embodiments, assuming magnitudes of injected signals N1 and N2 are approximately equivalent, processor unit 512 may digitally subtract actual-measured signals 610B from actual-measured 610A to suppress signals N1 and N2 injected by low-frequency signal 602 and retrieve the touch signals (i.e., sense signals 608A-608B). As such, it may be desirable to suppress the effect of low-frequency signal 602 on actual-measured signals 610A-610B as low-frequency signal 602 may generate noise causing substantial position jitters in the measured proximity of stylus 300 from touch sensor 10 due to the retrieved touch signals. Although this disclosure describes particular dual-measurement cycle based on particular self-capacitance measurement, the disclosure contemplates any suitable dual-measurement cycle based on any suitable self-capacitance measurement in any suitable manner.

In particular embodiments, sense signals 608A-608B may be based on one or more stylus signals rather than touch events associated with other capacitive objects to touch sensor 10, as described above. Furthermore, low-frequency signal 602 may be third-party noise. Referencing stylus 300 as a semi-active stylus with one or more signal activator inputs 222, the stylus signals may be generated by actuating one or more of the signal activator inputs 222 (e.g., by pressing one or more signal activator inputs 222), as described below. In particular embodiments, sense signals 608A-608B may be acquired by touch-sensor controller 12 of FIG. 6B based at least on dedicated stylus measurements. Furthermore, during both periods of acquisitions (i.e., $t_{00}$-$t_{01}$ and $t_{10}$-$t_{11}$), sense signals 608A-608B may be modulated by the third-party noise. As an example and not by way of limitation, the third-party noise may include line noise (approximately 50 Hz to approximately 60 Hz) or switching power supply noise (approximately 50 kHz to approximately 100 kHz). Accordingly, assuming magnitudes of injected signals N1 and N2 (due to the third-party noise) are approximately equivalent, processor unit 512 may digitally subtract actual-measured signals 610B from actual-measured 610A to suppress signals N1 and N2 injected by the third-party noise and retrieve the sense signals (i.e., sense signals 608A-608B) due to the stylus signals. As such, it may be desirable to suppress the effect of the third-party noise on actual-measured signals 610A-610B as the third-party noise may cause substantial position jitters in the measured proximity of stylus 300 from touch sensor 10 due to the retrieved sense signals.

Furthermore, processor unit 512 may apply one or more frequency sensitive algorithms (for example, Goertzel and/or FFT algorithms) to determine one or more frequency components (for example, frequency tones) and their associated strengths (for example, amplitudes) from the sense signals 608A-608B to determine information associated with actuating the signal activator inputs of stylus 300. As an example and not by way of limitation, the determined information may include any suitable combination of whether one or more of the signal activator inputs 222 are actuated, a proximity of stylus 300 to touch sensor 10, a position of stylus 300's projection on touch sensor 10, and any other suitable information. As another example and not by way of limitation, applying the frequency sensitive algorithms to dual-measured signal 612 on each Y line 512 may yield a strength of the injected stylus signal for each Y line 512. As yet another example and not by way of limitation, a combination of dedicated stylus measurements and acquisitions of sense signals (e.g., stylus signals) via one or more dual-measurement cycles may generate signal strength profiles across X coordinate axis and Y coordinate axis of touch sensor 10.

In particular embodiments, the signal strength profiles may be utilized by touch-sensor controller 12 to determine a position of stylus 300 relative to touch sensor 10. In particular embodiments, touch-sensor controller 12 may even utilize a difference between a signal strength of retrieved sense signals based on mutual-capacitance measurements and a signal strength of retrieved sense signals based on dedicated stylus measurements to estimate a distance (e.g., a Z coordinate distance) of stylus 300 (e.g., a tip 220 of stylus 300) from a surface of touch-sensor 10. Furthermore the strength of the injected stylus signal on each Y line 512 may determine whether a signal activator input 222 is actuated. As an example and not by way of limitation, if a pre-determined stylus signal having a particular frequency is detected on one or more Y lines 512, touch-sensor controller 12 may determine that a signal activator input 222 of stylus 300 is being actuated. In contrast, if a pre-determined stylus signal having a particular frequency is not detected on any of the Y lines 512, touch-sensor controller 12 may determine that none of the signal activator inputs 222 of stylus 300 are actuated. Furthermore, frequency sensitive algorithms may further substantially remove third-party noise having out-of-band frequencies and/or pre-determined frequencies that could cause aliasing on the desired stylus signals.

Although this disclosure describes and illustrates utilizing particular dual-measurement cycle based on particular stylus and particular dedicated stylus measurements to determine particular information of the particular stylus, the disclosure contemplates any suitable dual-measurement cycle based on any suitable stylus and any suitable dedicated stylus measurements to determine any suitable information of the any suitable stylus in any suitable manner.

In particular embodiments, touch-sensor controller 12 may be configured to increase immunity against third-party noise. As an example and not by way of limitation, touch-sensor controller 12 may be configured to increase an acquisition frequency of sense unit 504. In particular embodiments, an increase in the number of measured acquired digital samples may allow touch-sensor controller 12 to substantially improve a differentiation of the sense signals (e.g., touch signals and/or stylus signals) from third-party noise. As another example and not by way of limitation, touch-sensor controller 12 may further utilize one or more digital filtering techniques, such as median filtering and averaging, to suppress third-party noise. As yet another example and not by way of limitation, touch-sensor controller 12 may ensure that one or more of the integrator circuits in sense unit 504 do not saturate, thereby making it substantially difficult for touch-sensor controller 12 to remove third-party noise. In particular embodiments, stylus 300 may also be configured to increase immunity against third-party noise. As an example and not by way of limitation, stylus 300 may modulate (e.g., via amplitude modulation, such as on-off keying (OOK), or frequency modulation, such as frequency-shift keying (FSK)) a stylus signal (for example, a low-frequency and high-voltage signal as described above) being injected from stylus 300 into touch sensor 10 in a pre-determined pattern which makes it substantially easier for touch-sensor controller 12 to substantially remove third-party noise.

Although this disclosure describes particular examples of increasing noise immunity by particular touch-sensor controller and/or particular stylus, the disclosure contemplates increasing noise immunity by any suitable touch-sensor controller and/or any suitable stylus in any suitable manner.

Figure 8:
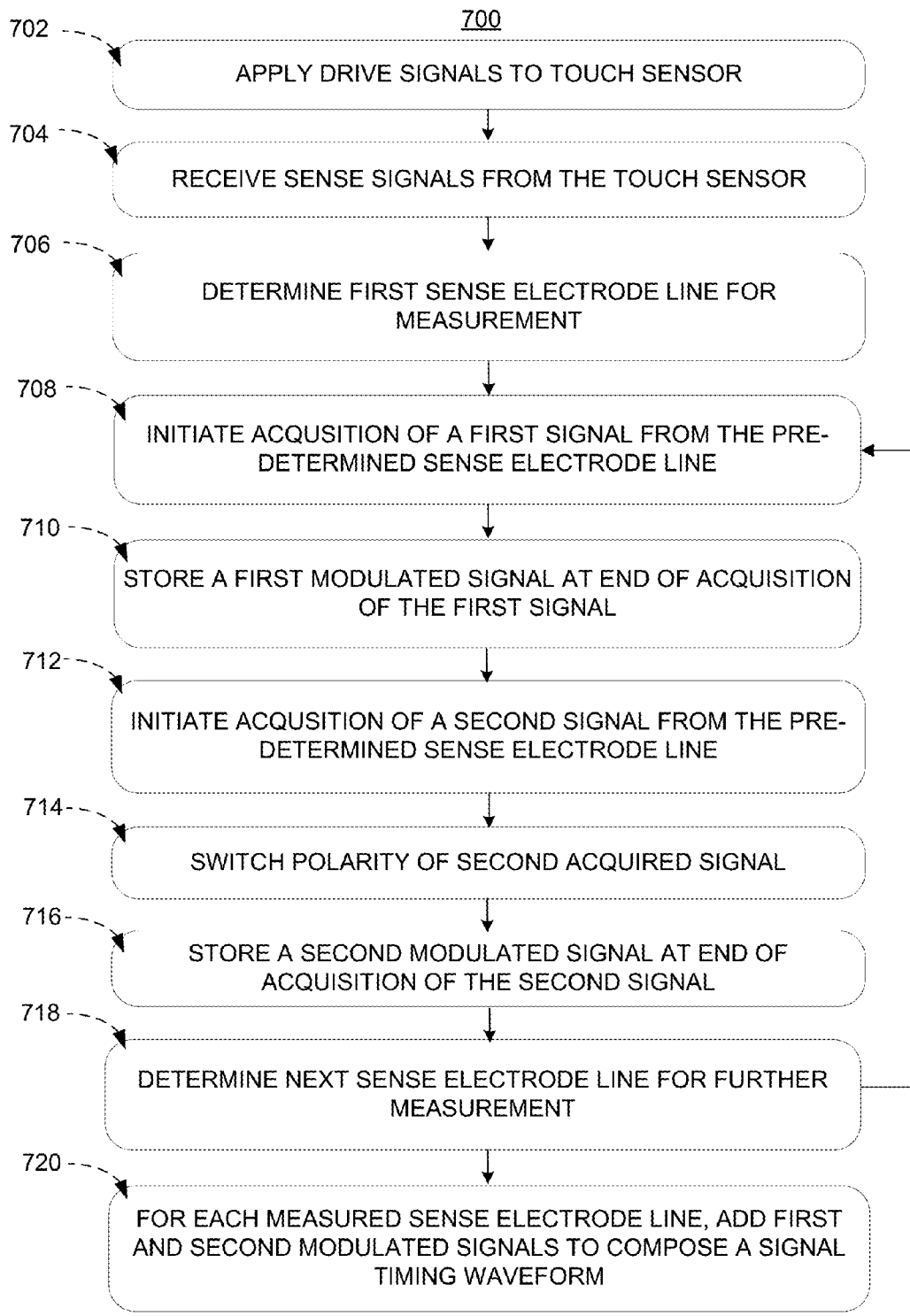
FIG. 8 illustrates an example method for mutual-capacitance dual-measurement by touch-sensor controller of FIG. 6A.

FIG. 8 illustrates example method 700 for mutual-capacitance dual-measurement by touch-sensor controller 12. Method 700 may start at step 702, where drive signals are applied to touch sensor 10 associated with touch-sensor controller 12 of FIG. 6A. In particular embodiments, one or more drive signals may be applied to one or more drive electrode lines of X lines 514 in touch sensor 10. As an example of FIG. 6A and not by way of limitation, one or more drive signals may be applied to each drive electrode line of X lines 514 in particular sequence and at particular time instances. Each electrode of the drive electrode line may be configured by the drive signals to generate electric field that projects upwards and outwards from the electrode. Accordingly the generated field may reach one or more neighboring sense electrode lines of Y lines 512. At step 704, sense signals are received from touch sensor 10. In particular embodiments, one or more sense signals may be received from each sense electrode line of Y lines 512. The sense signals may be produced in part by the electric field. Furthermore, the sense signals may indicate whether at least one object has come within proximity of touch sensor 10.

At step 706, a first sense electrode line of Y lines 512 may be pre-determined for measurement. As an example and not by way of limitation, the first sense electrode line may be determined such that any signals as generated from the first sense electrode line may be used to reliably detect whether an associated stylus 300 of FIG. 3 (within proximity of touch sensor 10) is activated.

The associated stylus 300 may include one or more signal activator inputs 222 as described above and illustrated by FIG. 3. When one of signal activator inputs 222 is pressed, stylus 300 may inject a third-party sinusoid electrical signal via tip 220 to touch sensor 10 as described above. As an example and not by way of limitation, the third-party sinusoid electrical signal may be low-frequency signal 602 of FIG. 7. As another example and not by way of limitation, the third-party sinusoid electrical signal may be any suitable high-voltage and low-frequency sinusoid electrical signal as described above. Accordingly, the location of the first electrode line may be optimal for receiving low-frequency signal 602 (or any other suitable high-voltage and low-frequency sinusoid signal) injected from stylus 300.

Although this disclosure describes and illustrates determination of particular sense electrode line of particular touch sensor for dual-measurement in a particular manner, the disclosure contemplates determination of any suitable sense electrode line of any suitable touch sensor for dual-measurement in any suitable manner. Moreover, although this disclosure describes a third-party signal as particular sinusoid signal, the disclosure contemplates the third-party signal as any suitable smooth wave. As an example and not by way of limitation, the third-party signal may be any smooth wave whose instantaneous rate of change of voltage over time is substantially within suitable limits.

At step 708, an acquisition of a first signal from the pre-determined sense electrode line is initiated. As an example of FIGS. 6A and 7 and not by way of limitation, the first signal may be sense signal 608A as acquired by sense unit 504 at time instance $t_{00}$. At step 710, a first modulated signal is stored at end of the acquisition of the first signal. The first modulated signal may include the first acquired signal that has been further modulated by one or more third-party sinusoid electrical signals during the acquisition of the first signal. Each of the third-party sinusoid electrical signals may be injected into touch sensor 10 and may operate at distinct frequency. As an example of FIG. 7 and not by way of limitation, the first modulated signal may be actual-measured signal 610A which includes sense signal 608A of magnitude S that is further modulated by injected signal 604A of magnitude N1 as described above. As another example of FIG. 7, the first modulated signal may be stored at time instance $t_{01}$.

At step 712, an acquisition of a second signal from the pre-determined sense electrode line is initiated. As an example of FIG. 7 and not by way of limitation, the acquisition of the second signal may take place at time instance $t_{10}$. At step 714, polarity of second acquired signal is reversed. In particular embodiments, polarity of second acquired signal may be reversed by sense unit 504 as described above. As an example of FIG. 7 and not by way of limitation, the second acquired signal as reversed may form sense signal 608B of magnitude −S. At step 716, a second modulated signal is stored at end of the acquisition of the second signal. In particular embodiments, the second modulated signal may include the second signal as acquired and whose polarity has been reversed. As with the first modulated signal of step 710, the second acquired signal may be further modulated by the one or more third-party sinusoid electrical signals during the acquisition of the second signal as described above. As an example of FIG. 7 and not by way of limitation, the second modulated signal may be actual-measured signal 610B of magnitude −S+N2 as a result of sense signal 608B being modulated by injected signal 604B during the acquisition of sense signal 608B. As another example of FIG. 7 and not by way of limitation, the second modulated signal may be stored at time instance $t_{11}$.

At step 718, the next sense electrode line for further measurement may be determined. In particular embodiments, method 700 may be used to detect and measure one or more objects within proximity of touch sensor 10. As an example of FIG. 7 and not by way of limitation, sense signal 608 may be doubled and injected signal 604 may be suppressed to allow for proximity measurement of the one or more objects. As such, the next sense electrode line of Y lines 512 to be measured may be a neighboring sense electrode line such that steps 708-718 may be repeated until signal from every sense electrode line of touch sensor 10 is being considered in order to determine approximate locations of the objects.

In particular embodiments, method 700 may be used to detect any third-party sinusoid electrical signal (for example, low-frequency signal 602) from associated stylus 300 of FIG. 3. As an example of FIG. 7 and not by way of limitation, sense signals 608A-608B may be suppressed and injected signals 604A-604B may be revealed allowing touch-sensor controller 12 to detect and measure the third-party sinusoid electrical signal as described above. Accordingly, a single sense electrode line of touch sensor 10 may be sufficient to be measured for obtaining information regarding the one or more third-party sinusoid electrical signals.

At step 720, for each measured sense electrode line, first and second modulated signals may be summed to compose a signal-timing waveform. As an example of FIG. 7 and not by way of limitation, adding actual-measured signal 610A (i.e., a first modulated signal) and actual-measured signal 610B (i.e., a second modulated signal) may produce dual-measured signal 612 of magnitude N1+N2 at time instance $t_{20}$. Method 700 may be repeated for multiple cycles to yield a signal-timing waveform for each sense electrode line of Y lines 512. As an example and not by way of limitation, magnitude of dual-measured signal 612 may be stored in an array for each repeated cycle. Accordingly, the array of dual-measured signal 612 magnitudes may compose the signal-timing waveform as described above.

In particular embodiments, each signal-timing waveform may be synthesized to produce one or more child timing patterns where each child timing pattern operates at a distinct frequency. The child timing patterns (individually or in combination) may be further post-processed to yield one or more embedded data. As an example of FIG. 3 and not by way of limitation, a child timing pattern of particular operating frequency produced by low-frequency signal 602 that is injected from stylus 300 and received by touch sensor 10 may indicate a particular button of signal activator inputs 222 of stylus 300 being pressed. As another example of FIG. 3 and not by way of limitation, multiple child timing patterns may be produced by multiple low-frequency signals that are injected from stylus 300 and received by touch sensor 10. Each low-frequency signal may be triggered by actuating a distinct signal activator input 222. By measuring a particular child timing pattern corresponding to a specific low-frequency signal, it may be possible to detect which signal activator input 222 is actuated. As yet another example and not by way of limitation, frequency of low-frequency signal 602 may be further modulated. Such further modulation may produce a corresponding change in the associated child timing pattern which may be used to transmit information (e.g., pressure information of tip 220) to touch-sensor controller 12.

Although this disclosure describes and illustrates particular steps of method 700 of FIG. 8 as occurring in a particular order, this disclosure contemplates any suitable steps including, but not limited to steps of method 700 of FIG. 8 occurring in any suitable order. As an example and not by way of limitation, step 720 may be initiated after one or more objects are detected to be within proximity of touch sensor 10 (e.g., touch events). As described above, to detect presence of the objects within proximity of touch sensor 10, injected signal 604 may be suppressed and sense signal 608 may be doubled for further post-processing. As another example and not by way of limitation, step 720 may even be modified to measure only those sense electrode lines that are associated with the touch events.

Moreover, although this disclosure describes and illustrates particular steps of method 700 for measuring injected signal 604 in particular manner, the disclosure contemplates any suitable combination of one or more suitable steps (including, but not limited to steps of method 700) for measuring injected signal 604 in any suitable manner. As an example and not by way of limitation, steps 702, 704, and 714 may be skipped in the absence of sense signals (for example, sense signals 608) from touch sensor 10. As another example and not by way of limitation, steps 702, 704, 712-716, and 720 may be skipped in the absence of sense signals (for example, sense signals 608) from touch sensor 10. By skipping such steps, touch-sensor controller 12 may directly perform sequential measurements of injected signal from each sense electrode line.

Although this disclosure describes and illustrates particular steps of method 700 for performing dual-measurements using mutual-capacitance, the disclosure contemplates any suitable combination of one or more suitable steps (including, but not limited to steps of method 700) for performing dual-measurements in any suitable implementation. In particular embodiments, dual-measurements may be performed using self-capacitance measurement. As an example of FIG. 8 and not by way of limitation, steps 702 and 704 may be combined to implement self-capacitance measurement. Furthermore, although this disclosure describes and illustrates particular components, devices, or systems carrying out particular steps of the method 700 of FIG. 8, this disclosure contemplates any suitable combination of any suitable components, devices, or systems carrying out any suitable steps of the method 700 of FIG. 8.

Figure 9:
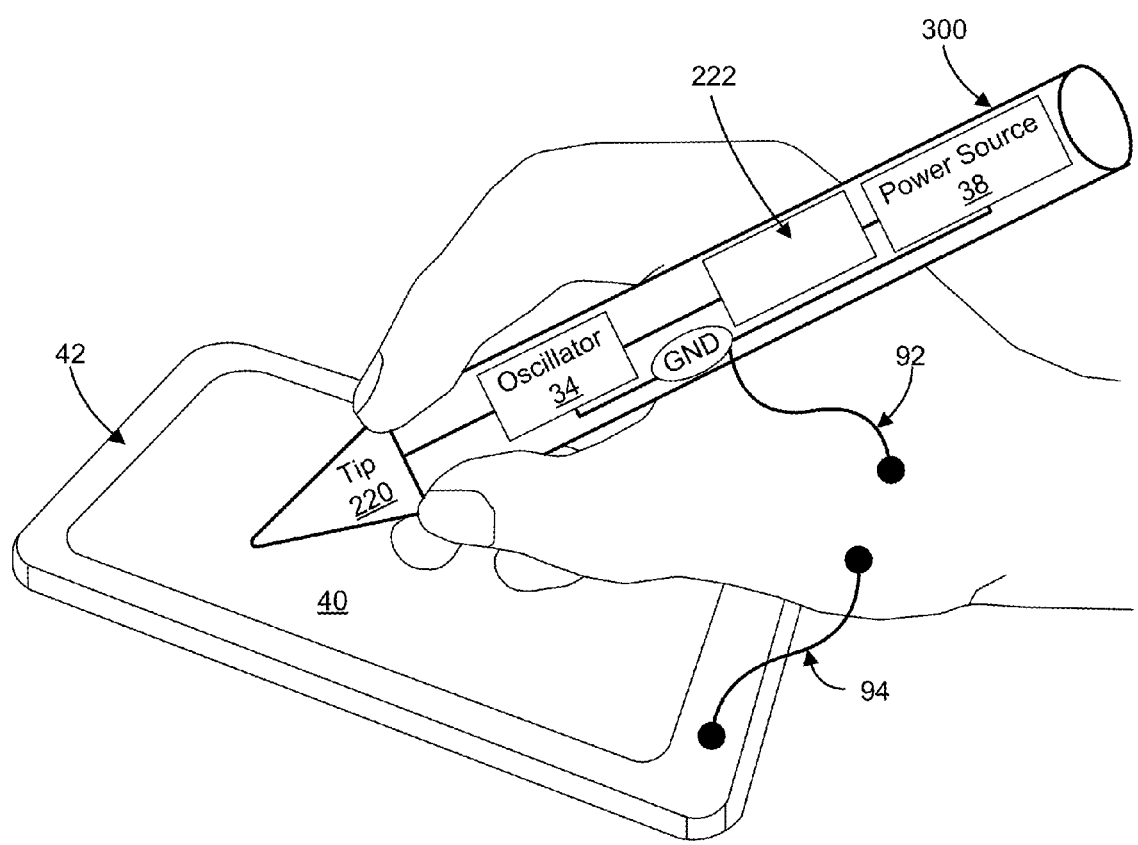
FIG. 9 illustrates example groundings of a stylus within proximity of a device.

FIG. 9 illustrates example groundings of stylus 300 within proximity of touch-sensitive area 40 of device 42. In particular embodiments, device 42 may include a touch screen. In the example of FIG. 9, a user's hand is holding stylus 300 within proximity of device 42. Furthermore, stylus 300 may be a passive stylus having a signal activator input 222. In particular embodiments, a functionality of stylus 300 as a capacitive device for touch-sensing by device 42 may depend at least on a capacitive loading of tip 220 of stylus 300. As an example and not by way of limitation, if signal activator input 222 is not actuated and the capacitive loading of tip 220 of stylus 300 is above a pre-determined loading threshold, stylus 300 may be detected by a touch-sensor controller 10 of device 42. In particular embodiments, the capacitive loading between tip 220 of stylus 300 and a GND of stylus 300 (e.g., GND of oscillator 34) may be configured to be above the pre-determined loading threshold.

In the example of FIG. 9, in response to actuation of signal activator input 222, oscillator 34 may generate a low-frequency and high-voltage signal to device 42 via tip 220 in response to an actuation of signal activator input 222. Furthermore, a GND of oscillator 34 may be coupled galvanically (or capacitively) to outer body 216 (for example, a barrel) of stylus 300. As such, a user holding stylus 300 may be galvanically (or capacitively) coupled to the GND of oscillator 34 via coupling 92. At the same time, the user may be galvanically (or capacitively) coupled to a GND of device 42 via coupling 94.

Although this disclosure describes and illustrates particular groundings of particular stylus 300 that generates particular signal in a particular manner, the disclosure contemplates any suitable groundings of any suitable stylus that generates any suitable signal in any suitable manner. Furthermore, although this disclosure describes and illustrates particular galvanic or capacitive couplings between particular stylus 300, particular user, and particular device, the disclosure contemplates any suitable galvanic or capacitive couplings between any suitable stylus, any suitable user, and any suitable device in any suitable manner.

Figure 10:
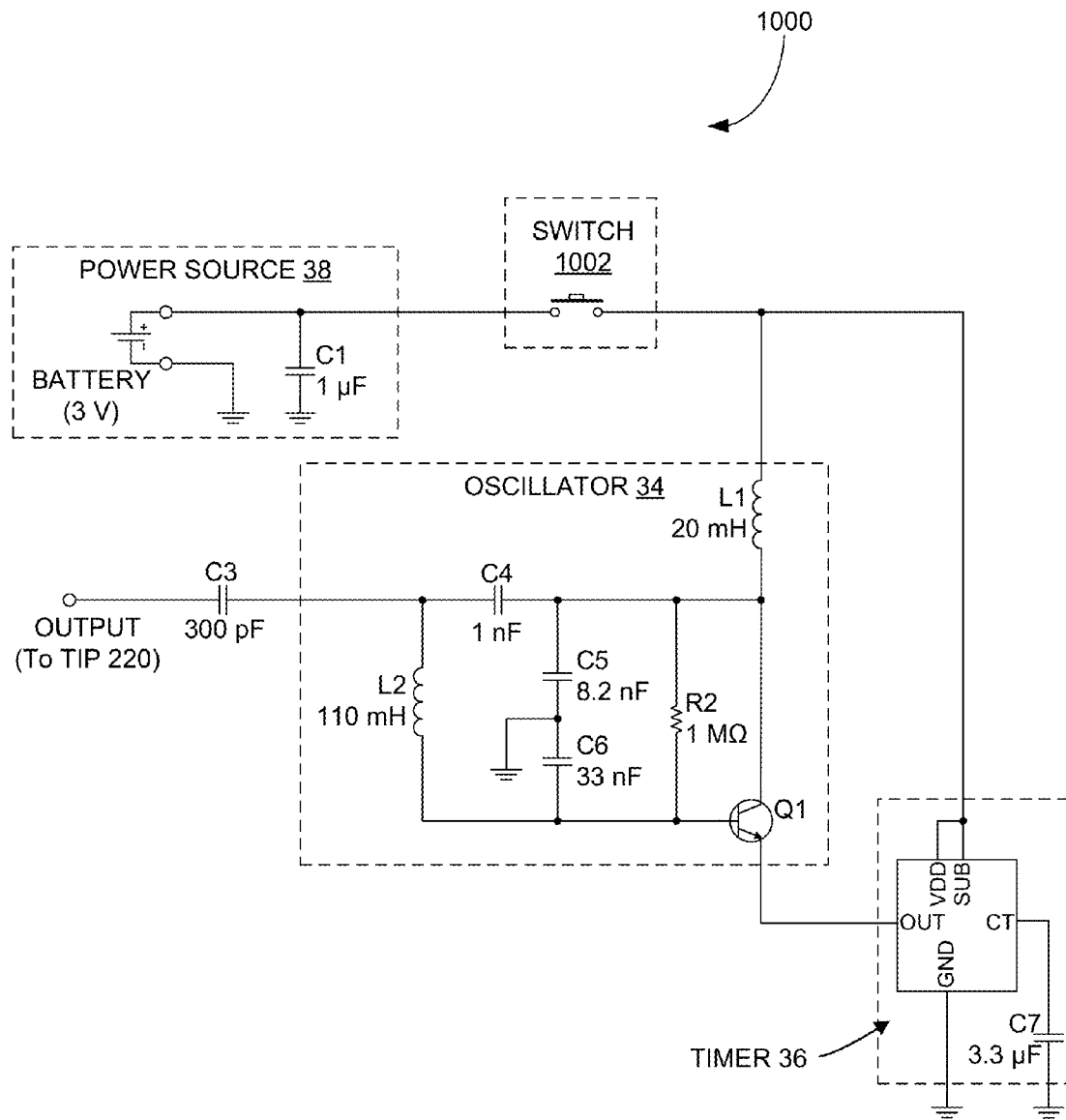
FIG. 10 illustrates an example schematic of a stylus.

FIG. 10 illustrates schematic 1000 of stylus 300. In the example of FIG. 10, schematic 1000 may include power source 38, oscillator 34, and timer 36 as described above. In certain embodiments, oscillator 34 includes a Clapp oscillator. In addition, schematic 1000 may include switch 1002 that couples power source 38 to oscillator 34 and timer 36.

In the example of FIG. 10, stylus 300 may be a passive stylus having one or more signal activator inputs 222 (e.g., a semi-active stylus). When a signal activator input 222 is actuated (for example, by pressing signal activator input 222), switch 1002 may be configured to couple power source 38 to oscillator 34 and timer 36. Thereafter, oscillator 34 may generate (i.e., output) a low-frequency and high-voltage signal to tip 220 of stylus 300. As an example and not by way of limitation, when signal activator input 222 is actuated, oscillator 34 may generate a low-frequency and high-voltage signal of approximately 20V to approximately 30V and of approximately 16 kHz to tip 220 of stylus 300.

At substantially the same time, timer 36 may be configured to initiate a timing mechanism. If a timing of timer 36 has reached a pre-determined threshold, timer 36 may configure oscillator 34 to stop generating the low-frequency and high-voltage signal. Otherwise, if the timing of timer 36 has not reached the pre-determined threshold, timer 36 may configure oscillator 34 to continue generating the low-frequency and high-voltage signal until switch 1002 is configured to disable coupling of power source 38 to oscillator 34.

In particular embodiments, switch 1002 may be configured to disable the coupling by the user releasing the actuation of the signal activator input 222 (e.g., stop pressing signal activator input 222). In particular embodiments, a capacitive loading of tip 220 of stylus 300 may be maintained above the pre-determined threshold in order for stylus 300 to be detected by touch sensor 10 when oscillator 34 is disabled.

Although this disclosure describes and illustrates particular schematic including particular electrical components for particular stylus 300 having particular signal activator input 222, the disclosure contemplates any suitable schematic including any suitable combination of one or more suitable components for any suitable passive stylus having any suitable number of any suitable signal activator input.

Figure 11:
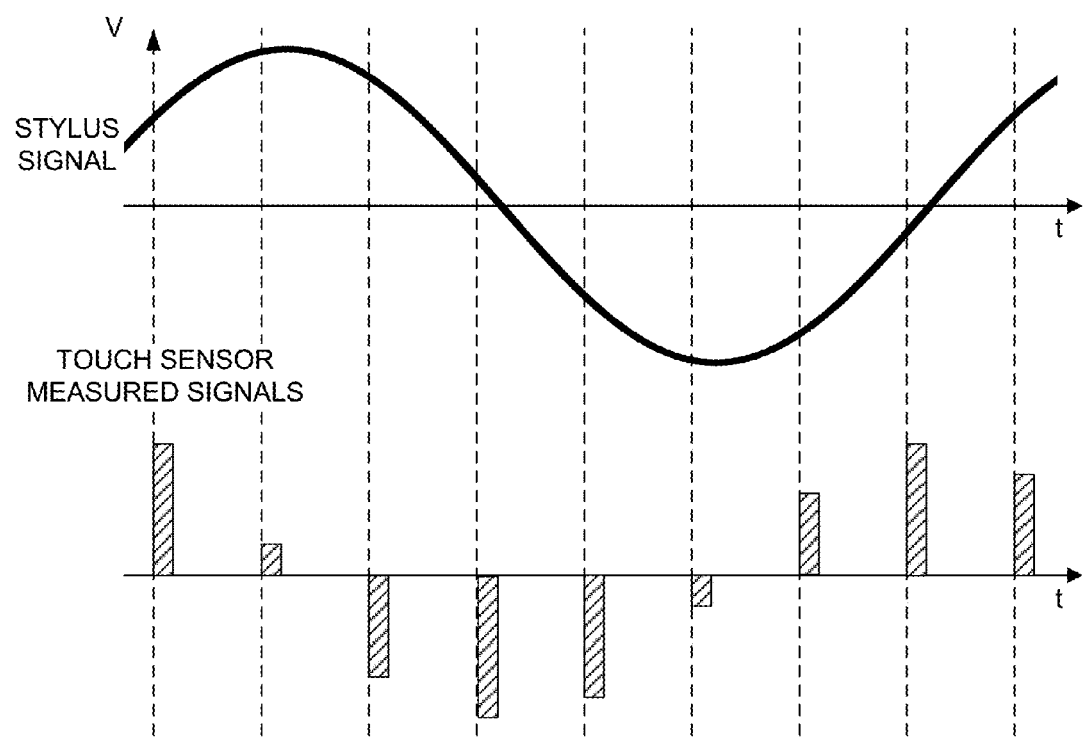
FIG. 11 illustrates an example stylus signal injected by a stylus and associated example touch sensor signals measured by a touch-sensor controller.

FIG. 11 illustrates a stylus signal injected by stylus 300 and associated touch sensor signals measured by touch-sensor controller 12. In the example of FIG. 11, stylus 300 may be a passive stylus having one or more signal activator inputs 222, as described above. Furthermore, the stylus signal may be generated when a user actuates a signal activator input 222 of stylus 300 held within proximity of touch sensor 10. In particular embodiments, the stylus signal may be a low-frequency and high-voltage signal, as described above.

In the example of FIG. 11, touch-sensor controller 12 may generate the touch sensor measured signals corresponding to the stylus signal. Furthermore, the touch measured signals may be proportional to dV/dt of the stylus signal, where dV/dt of the stylus signal corresponds to a change in voltage amplitude versus a change in time of the stylus signal. As an example and not by way of limitation, in response to the received stylus signal, touch-sensor controller 12 may perform dedicated stylus measurements to generate digital samples corresponding to a plurality of dual-measured signals 612, as described and illustrated by FIG. 7, where the dedicated stylus measurements are based on the stylus signal and the dual-measured signals 612 correspond to the measured stylus signal. As another example and not by way of limitation, in response to the received stylus signal, touch-sensor controller 12 may perform mutual-capacitance or self-capacitance measurements to generate digital samples corresponding to a plurality of dual-measured signals 612 as described and illustrated by FIG. 7, where the mutual-capacitance or self-capacitance measurements are based on one or more touch events and the dual-measured signals 612 correspond to the touch sensor measured signals.

Although this disclosure describes and illustrates particular stylus signal injected by particular stylus and particular touch sensor signals measured by particular touch-sensor controller, the disclosure contemplates any suitable stylus signal injected by any suitable stylus and any suitable touch sensor signals measured by any suitable touch-sensor controller.

Figure 12:
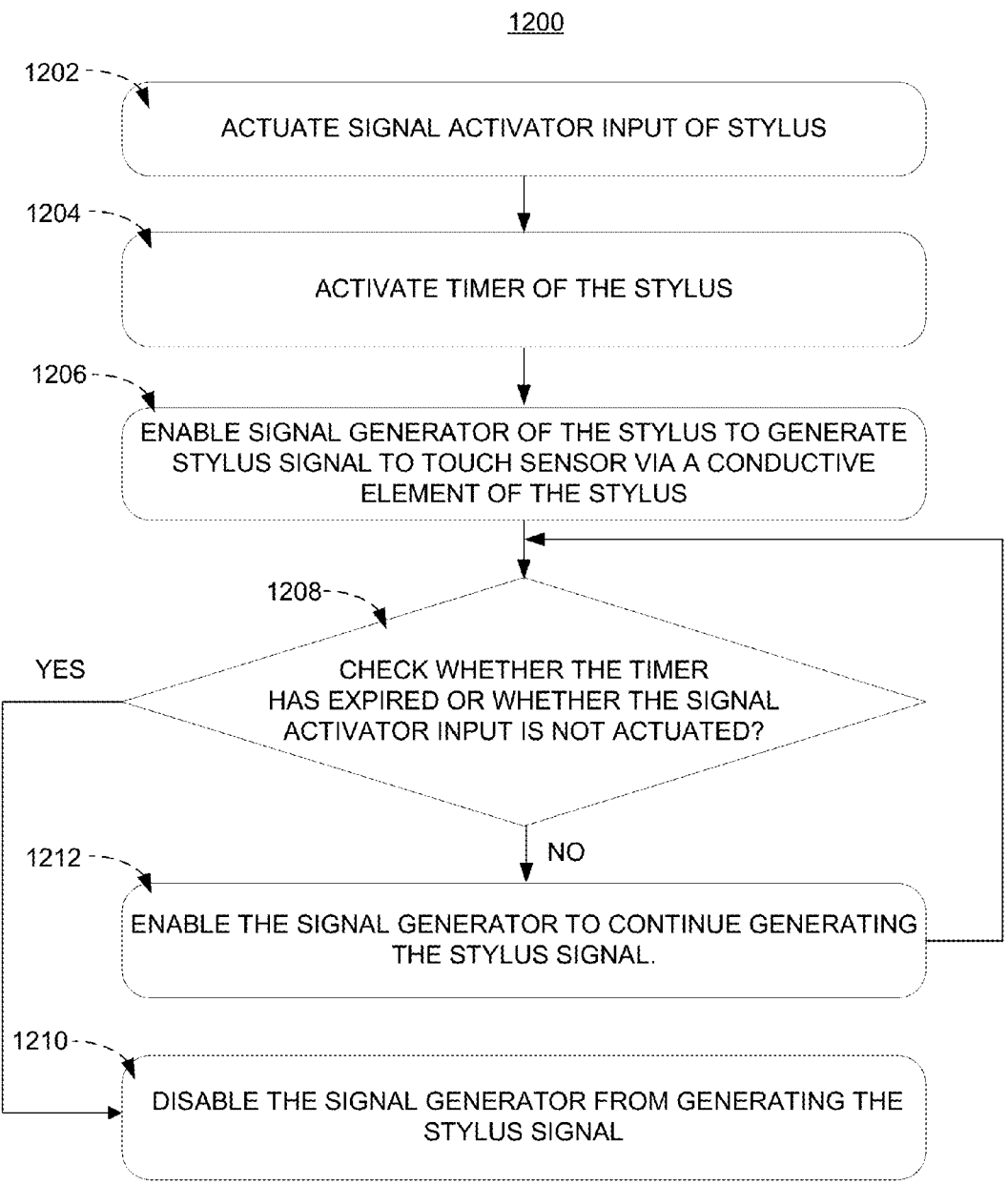
FIG. 12 illustrates an example method for generating a stylus signal.

FIG. 12 illustrates method 1200 for generating a stylus signal. In method 1200 of FIG. 12, method 1200 may be associated with a stylus, such as stylus 300, corresponding to a passive stylus having a signal activator input 222. Furthermore, portions of method 1200 may be performed by a user or stylus 300. In particular embodiments, stylus 300 may be operated based at least on schematic 1000 of FIG. 10.

At step 1202, the user actuates signal activator input of the stylus. As an example and not by way of limitation, the user may actuate (e.g., press) signal activator input 222 (e.g., button) of stylus 300. At step 1204, the stylus activates timer of the stylus. As an example and not by way of limitation, in response to the user actuating signal activator input 222, power source 38 may be coupled to timer 36 of stylus 300. Furthermore, coupling of power source 38 to timer 36 may activate timer 36. In certain embodiments, the user may hold stylus 300 within proximity of touch sensor 10 when actuating signal activator input 222. In particular embodiments, referencing schematic 1000 of FIG. 10, when the user actuates signal activator input 222 of stylus 300, switch 1002 may be configured to couple power source 38 and timer 36, thereby activating timer 36 to initiate a timing.

At step 1206, the stylus enables signal generator of the stylus to generate a stylus signal to touch sensor via a conductive element of the stylus. In certain embodiments, the signal generator may be an oscillator, such as oscillator 34, of the stylus. As an example and not by way of limitation, in response to the user actuating signal activator input 222, power source 38 may be coupled to oscillator 34 of stylus 300. Furthermore, coupling of power source 38 to oscillator 34 may enable oscillator 34 to generate the stylus signal to touch sensor 10 via the conductive element of stylus 300. In certain embodiments, the conductive element may be a tip, such as tip 220, of the stylus. Furthermore, the stylus signal may be detectable by a device through the touch sensor of the device when the stylus is in proximity to the touch sensor of the device In particular embodiments, the stylus signal may be a low-frequency and high-voltage signal, as described above. In particular embodiments, referencing schematic 1000 of FIG. 10, when the user actuates signal activator input 222 of stylus 300, switch 1002 may be configured to couple power source 38 and oscillator 34, thereby activating oscillator 34 to generate the stylus signal.

At step 1208, the stylus checks whether the timer has expired or whether the signal activator input is not actuated. As an example and not by way of limitation, stylus 300 may check whether the timing of timer 36 has reached a pre-determined threshold. As another example and not by way of limitation, the stylus checks whether signal activator input 222 is not actuated by the user. At step 1210, if the timer has expired or the signal activated input is not actuated, the stylus disables the signal generator from generating the stylus signal. As an example and not by way of limitation, referencing schematic 1000 of FIG. 10, if the timing of timer 36 has reached the pre-determined threshold, stylus 300 may disable oscillator 34 from generating the stylus signal. As another example and not by way of limitation, referencing schematic 1000 of FIG. 10, when signal activator input 222 is not actuated by the user, switch 1002 may be configured to decouple power source 38 and oscillator 34, thereby disabling oscillator 34 from generating the stylus signal. At step 1212, if the timer has not expired or the signal activator input is actuated, the stylus may enable the signal generator to continue generating the stylus signal. Furthermore, step 1208 and 1212 may be repeated until the timer has expired or the signal activator input is not actuated. As an example and not by way of limitation, referencing schematic 1000 of FIG. 10, if the timing of timer 36 has not reached the pre-determined threshold, oscillator 34 may continue generating the stylus signal until signal activator input 222 is not actuated by the user (e.g., possibly subject to additional checks of timer 36). As another example and not by way of limitation, referencing schematic 1000 of FIG. 10, when signal activator input 222 is actuated by the user, switch 1002 may be configured to continue coupling power source 38 and oscillator 34, thereby enabling oscillator 34 to continue generating the stylus signal. As such, steps 1208 and 1212 may be repeated until the timing of timer 36 reached the pre-determined threshold or the user does not actuate signal activator input 222.

Although this disclosure describes and illustrates particular steps of method 1200 of FIG. 12 as occurring in a particular order, this disclosure contemplates any suitable steps including, but not limited to steps of method 1200 of FIG. 12 occurring in any suitable order. Although this disclosure describes and illustrates particular steps of method 1200 for generating particular stylus signal, the disclosure contemplates any suitable combination of one or more suitable steps (including, but not limited to steps of method 1200) for generating any suitable stylus signal in any suitable implementation. Furthermore, although this disclosure describes and illustrates particular components, devices, or systems carrying out particular steps of the method 1200 of FIG. 12, this disclosure contemplates any suitable combination of any suitable components, devices, or systems carrying out any suitable steps of the method 1200 of FIG. 12.

Although this disclosure describes various operations as being performed by stylus 300, this disclosure contemplates these operations being performed by stylus 200 or any other suitable stylus. For example and not by way of limitation, although this disclosure describes stylus 300 as being operable to transmit a high frequency and low voltage signal in response to stylus 300 detecting activation of signal activator input (e.g., by a user of stylus 300), this disclosure contemplates stylus 200 (or any other suitable stylus) as being operable to transmit a high frequency and low voltage signal in response to stylus 200 detecting activation of a signal activator input (e.g., by a user of stylus 300), such as activation of one or more buttons 206.

Herein, reference to a computer-readable non-transitory storage medium or media may include one or more semiconductor-based or other integrated circuits (ICs) (such, as for example, a field-programmable gate array (FPGA) or an application-specific IC (ASIC)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards, SECURE DIGITAL drives, any other suitable computer-readable non-transitory storage medium or media, or any suitable combination of two or more of these, where appropriate. A computer-readable non-transitory storage medium or media may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A controller comprising:
   one or more computer-readable non-transitory storage media embodying logic that is operable when executed to:
      initiate an acquisition of a first signal from an electrode of a touch sensor according to an acquisition frequency of the touch sensor;
      store a first modulated signal, wherein the first modulated signal comprises a modulated form of the first signal;
      initiate an acquisition of a second signal from the electrode of the touch sensor according to the acquisition frequency of the touch sensor;
      reverse a polarity of the second signal, received in response to initiating the acquisition of the second signal from the electrode of the touch sensor according to the acquisition frequency of the touch sensor, to produce a third signal;
      store a second modulated signal, wherein the second modulated signal comprises a modulated form of the third signal;
      generate a signal-timing waveform based on the first and second modulated signals; and
      retrieve, from the generated signal-timing waveform, information associated with a stylus.

2. The controller of claim 1, wherein:
   the first signal is associated with a first transmission from the stylus;
   the first modulated signal is stored at an end of the acquisition of the first signal;
   the first signal is modulated by one or more third-party signals during the acquisition of the first signal;
   the second signal is associated with a second transmission from the stylus;
   the second modulated signal is stored at an end of the acquisition of the second signal;
   the third signal is modulated by the one or more third-party signals during the acquisition of the second signal;
   the signal-timing waveform is generated based on subtracting the second modulated signal from the first modulated signal;

the generated signal-timing waveform substantially suppresses the one or more third-party signals; and the generated signal-timing waveform is based on the first and second signals.

3. The controller of claim 1, wherein the stylus is a passive stylus having a signal activator input.

4. The controller of claim 3, wherein the information associated with the passive stylus comprises a state of the signal activator input.

5. The controller of claim 1, wherein the information associated with the stylus comprises one or more of:
a proximity of the stylus from the touch sensor; and
a position of the stylus's projection onto the touch sensor.

6. The controller of claim 1, wherein retrieving information associated with the stylus from the generated signal-timing waveform comprises:
analyzing the generated signal-timing waveform to determine a frequency component of the generated signal-timing waveform; and
determining, from the determined frequency component of the generated signal-timing waveform, the information associated with the stylus.

7. The controller of claim 1, wherein the electrode of the touch sensor comprises a drive electrode reconfigured to sense signals.

8. A method comprising:
initiating an acquisition of a first signal from an electrode of a touch sensor according to an acquisition frequency of the touch sensor, wherein the first signal is associated with a first transmission from a stylus;
storing a first modulated signal, wherein the first modulated signal comprises a modulated form of the first signal;
initiating an acquisition of a second signal from the electrode of the touch sensor according to the acquisition frequency of the touch sensor, wherein the second signal is associated with a second transmission from the stylus;
reversing, with a controller, a polarity of the second signal, received in response to initiating the acquisition of the second signal from the electrode of the touch sensor according to the acquisition frequency of the touch sensor, to produce a third signal;
storing a second modulated signal, wherein the second modulated signal comprises a modulated form of the third signal;
generating a signal-timing waveform based on the first and second modulated signals; and
retrieving, with the controller, from the generated signal-timing waveform, information associated with the stylus.

9. The method of claim 8, wherein:
the first modulated signal is stored at an end of the acquisition of the first signal;
the first signal is modulated by one or more third-party signals during the acquisition of the first signal;
the second modulated signal is stored at an end of the acquisition of the second signal;
the third signal is modulated by the one or more third-party signals during the acquisition of the second signal;
the signal-timing waveform is generated based on subtracting the second modulated signal from the first modulated signal;
the generated signal-timing waveform substantially suppresses the one or more third-party signals; and
the generated signal-timing waveform is based on the first and second signals.

10. The method of claim 8, wherein the stylus is a passive stylus having a signal activator input.

11. The method of claim 10, wherein the information associated with the passive stylus comprises a state of the signal activator input.

12. The method of claim 8, wherein the information associated with the stylus comprises one or more of:
a proximity of the stylus from the touch sensor; and
a position of the stylus's projection onto the touch sensor.

13. The method of claim 8, wherein retrieving information associated with the stylus from the generated signal-timing waveform comprises:
analyzing, with the controller, the generated signal-timing waveform to determine a frequency component of the generated signal-timing waveform; and
determining, with the controller, from the determined frequency component of the generated signal-timing waveform, the information associated with the stylus.

14. The method of claim 8, wherein retrieving information associated with the stylus from the generated signal-timing waveform comprises:
determining, with the controller, a signal strength profile of the generated signal-timing waveform across a X axis and a Y axis of the touch sensor; and
determining, with the controller, from the determined signal strength profile of the generated signal-timing waveform, the information associated with the stylus.

15. The method of claim 8, wherein the electrode of the touch sensor comprises a drive electrode reconfigured to sense signals.

16. A system comprising:
a stylus configured to transmit a stylus signal;
a touch sensor configured to receive the stylus signal from the stylus, the touch sensor comprising an electrode; and
a controller comprising one or more computer-readable non-transitory storage media embodying logic that is operable when executed to:
initiate an acquisition of a first stylus signal from the electrode of the touch sensor according to an acquisition frequency of the touch sensor, wherein the first stylus signal is associated with a first transmission from the stylus;
store a first modulated signal, wherein the first modulated signal comprises a modulated form of the first stylus signal;
initiate an acquisition of a second stylus signal from the electrode of the touch sensor according to the acquisition frequency of the touch sensor, wherein the second stylus signal is associated with a second transmission from the stylus;
reverse a polarity of the second stylus signal to produce a third signal;
store a second modulated signal, wherein the second modulated signal comprises a modulated form of the third signal;
generate a signal-timing waveform based on:
adding the first modulated signal and the second modulated signal; or
calculating a difference between the first modulated signal and the second modulated signal; and
retrieve, from the generated signal-timing waveform, information associated with the stylus.

17. The system of claim 16, wherein the stylus comprises:
an electrically conductive stylus tip;

a signal generator coupled to the stylus tip; and
a signal activator input configured to initiate:
- a coupling, in response to an actuation of the signal activator input, of a power source to the signal generator to thereby cause the signal generator to generate the stylus signal;
- an application of the stylus signal to the stylus tip to thereby cause the stylus signal to be emitted by the stylus tip such that the emitted stylus signal is detectable by the touch sensor; and
- a decoupling, in response to an end of the actuation, of the power source from the signal generator to thereby disable generation of the stylus signal by the signal generator.

18. The system of claim 17, wherein:
the stylus further comprises a timer; and
the signal activator input is further configured to initiate a coupling, in response to the actuation of the signal activator input, of the power source to the timer to thereby activate the timer, wherein:
- the signal generator generates the stylus signal if the activated timer has not expired; and
- the generation of the stylus signal by the signal generator is disabled if the activated timer expires prior to the end of the actuation.

19. The system of claim 17, wherein the signal activator input comprises one or more of:
a mechanical element located on an exterior surface of the stylus; and
a touch sensitive surface located on the exterior surface of the stylus.

20. The system of claim 17, wherein the signal activator input comprises a mechanical element located on an exterior surface of the stylus, the mechanical element comprising one or more of:
a mechanical button;
a mechanical switch; and
a mechanical slider.

21. The system of claim 17, wherein the signal generator comprises an oscillator.

22. The system of claim 17, wherein:
a GND of the signal generator is coupled to a barrel of the stylus, wherein the barrel is electrically conductive; and
the coupling of the GND of the signal generator to the barrel of the stylus allows the GND of the signal generator to be electrically coupled to a user of the stylus.

23. The system of claim 17, wherein a capacitive load of the stylus tip of the stylus is above a pre-determined threshold when the signal activator input is not actuated.

24. The system of claim 16, wherein the stylus signal is a sinusoidal signal having:
a voltage amplitude of approximately 20V to approximately 30V; and
a frequency of approximately 14 kHz to approximately 16 kHz.

* * * * *